United States Patent
Noble

(10) Patent No.: US 6,304,483 B1
(45) Date of Patent: *Oct. 16, 2001

(54) CIRCUITS AND METHODS FOR A STATIC RANDOM ACCESS MEMORY USING VERTICAL TRANSISTORS

(75) Inventor: Wendell P. Noble, Milton, VT (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/028,727

(22) Filed: Feb. 24, 1998

(51) Int. Cl.[7] ................................................... G11C 11/00
(52) U.S. Cl. .......................... 365/156; 365/154; 257/331
(58) Field of Search .................................... 365/154, 156, 365/174; 257/381, 904, 380, 331, 334; 438/155, 152

(56) References Cited

U.S. PATENT DOCUMENTS

| | | | |
|---|---|---|---|
| 4,051,354 | 9/1977 | Choate | 235/312 |
| 4,604,162 | 8/1986 | Sobczak | 156/657 |
| 4,663,831 | 5/1987 | Birrittella et al. | 29/576 E |
| 4,673,962 | 6/1987 | Chatterjee et al. | 357/23.6 |
| 4,740,826 | 4/1988 | Chatterjee | 357/42 |
| 4,761,768 | 8/1988 | Turner et al. | 365/201 |
| 4,766,569 | 8/1988 | Turner et al. | 365/185 |
| 4,920,065 | 4/1990 | Chin et al. | 437/52 |
| 4,958,318 | 9/1990 | Harari | 365/149 |
| 4,987,089 | 1/1991 | Roberts | 437/34 |
| 5,001,526 | 3/1991 | Gotou | 357/23.6 |
| 5,006,909 | 4/1991 | Kosa | 357/23.6 |

(List continued on next page.)

OTHER PUBLICATIONS

Adler, E., et al., "The Evolution of IBM CMOS DRAM Technology", *IBM Journal of Research and Development*, 39, 167–188, (Jan./Mar. 1995).

Asai, S., et al., "Technology Challenges for Integration Near and Below 0.1 $\mu$m", Proceedings of the IEEE, 85, Special Issue on Nanometer–Scale Science & Technology, 505–520, (Apr. 1997).

Banerjee, S.K., et al., "Characterization of Trench Transistors for 3–D Memories", 1986 Symposium on VLSI Technology, Digest of Technical Papers, San Diego, CA, 79–80, (May 28–30, 1986).

Blalock, T.N., et al., "A High–Speed Sensing Scheme for 1T Dynamic RAM's Utilizing the Clamped Bit–Line Sense Amplifier", *IEEE Journal of Solid–State Circuits*, 27, 618–625, (Apr. 1992).

(List continued on next page.)

*Primary Examiner*—A. Zarabian
(74) *Attorney, Agent, or Firm*—Schwegman, Lundberg, Woessner & Kluth, P.A.

(57) ABSTRACT

A memory cell. The memory cell has a flip-flop that includes a cross-coupled pair of inverters. The inverters each include a pair of complementary, vertical transistors. A gate contact interconnects the gates of the inverters and acts as the input of the inverter. A shunt interconnects a first source/drain region of the complementary transistors and acts as the output of the inverter. A first vertical, access transistor is also included. The first vertical, access transistor has a gate that is coupled to a word line, a first source/drain region that is coupled to the output of one of the inverters, and a second source/drain region that is coupled to a first bit line. A second vertical, access transistor is also provided. The second vertical, access transistor has a gate that is coupled to the word line, a first source/drain region that is coupled to the output of the other inverter, and a second source/drain region that is coupled to a second bit line.

36 Claims, 18 Drawing Sheets

U.S. PATENT DOCUMENTS

| | | | |
|---|---|---|---|
| 5,017,504 | 5/1991 | Nishimuro et al. | 437/40 |
| 5,021,355 | 6/1991 | Dhong et al. | 437/35 |
| 5,028,977 | 7/1991 | Kenneth et al. | 357/43 |
| 5,057,896 | 10/1991 | Gotou | 357/49 |
| 5,072,269 | 12/1991 | Hieda | 357/23.6 |
| 5,102,817 | 4/1992 | Chatterjee et al. | 437/47 |
| 5,110,752 | 5/1992 | Lu | 437/47 |
| 5,140,388 | 8/1992 | Bartelink | 357/23.4 |
| 5,156,987 | 10/1992 | Sandhu et al. | 437/40 |
| 5,177,028 | 1/1993 | Manning | 437/41 |
| 5,177,576 | 1/1993 | Kimura et al. | 257/71 |
| 5,202,278 | 4/1993 | Mathews et al. | 437/47 |
| 5,208,657 | 5/1993 | Chatterjee et al. | 257/302 |
| 5,216,266 | 6/1993 | Ozaki | 257/302 |
| 5,223,081 | 6/1993 | Doan | 156/628 |
| 5,266,514 | 11/1993 | Tuan et al. | 437/52 |
| 5,308,782 * | 5/1994 | Mazure | 437/52 |
| 5,316,962 | 5/1994 | Matsuo et al. | 437/52 |
| 5,320,880 | 6/1994 | Sandhu et al. | 427/578 |
| 5,327,380 | 7/1994 | Kersh, III et al. | 365/195 |
| 5,376,575 | 12/1994 | Kim et al. | 437/52 |
| 5,379,255 | 1/1995 | Shah | 365/185 |
| 5,382,540 | 1/1995 | Sharma et al. | 437/52 |
| 5,391,911 | 2/1995 | Beyer et al. | 257/522 |
| 5,392,245 | 2/1995 | Manning | 365/200 |
| 5,393,704 | 2/1995 | Huang et al. | 437/203 |
| 5,396,093 | 3/1995 | Lu | 257/306 |
| 5,410,169 | 4/1995 | Yamamoto et al. | 257/301 |
| 5,414,287 | 5/1995 | Hong | 257/316 |
| 5,416,350 | 5/1995 | Watanabe | 257/330 |
| 5,416,736 * | 5/1995 | Kosa | 257/381 |
| 5,422,296 * | 6/1995 | Lage | 437/57 |
| 5,422,499 | 6/1995 | Manning | 257/67 |
| 5,427,972 | 6/1995 | Shimizu et al. | 437/52 |
| 5,432,739 | 7/1995 | Pein | 365/185 |
| 5,438,009 | 8/1995 | Yang et al. | 437/52 |
| 5,440,158 | 8/1995 | Sung-Mu | 257/314 |
| 5,443,992 | 8/1995 | Risch et al. | 437/29 |
| 5,445,986 | 8/1995 | Hirota | 437/60 |
| 5,460,316 | 10/1995 | Hefele | 228/39 |
| 5,460,988 | 10/1995 | Hong | 437/43 |
| 5,466,625 | 11/1995 | Hsieh et al. | 437/52 |
| 5,483,094 | 1/1996 | Sharma et al. | 257/316 |
| 5,483,487 | 1/1996 | Sung-Mu | 365/185.33 |
| 5,492,853 | 2/1996 | Jeng et al. | 437/60 |
| 5,495,441 | 2/1996 | Hong | 365/185.01 |
| 5,497,017 | 3/1996 | Gonzales | 257/306 |
| 5,504,357 | 4/1996 | Kim et al. | 257/306 |
| 5,508,219 | 4/1996 | Bronner et al. | 437/52 |
| 5,508,542 | 4/1996 | Geiss et al. | 257/301 |
| 5,519,236 | 5/1996 | Ozaki | 257/302 |
| 5,528,062 | 6/1996 | Hsieh et al. | 257/298 |
| 5,563,083 | 10/1996 | Pein | 437/43 |
| 5,574,299 | 11/1996 | Kim | 257/296 |
| 5,576,238 * | 11/1996 | Fu | 437/52 |
| 5,593,912 | 1/1997 | Rajeevakumar | 437/52 |
| 5,616,934 | 4/1997 | Dennison et al. | 257/67 |
| 5,640,342 | 6/1997 | Gonzalez | 365/156 |
| 5,644,540 | 7/1997 | Manning | 365/200 |
| 5,646,900 | 7/1997 | Tsukude et al. | 365/205 |
| 5,691,230 | 11/1997 | Forbes | 437/62 |
| 5,705,415 | 1/1998 | Orlowski et al. | 437/43 |
| 5,707,885 | 1/1998 | Lim | 437/52 |
| 5,780,888 | 7/1998 | Maeda et al. | 257/302 |
| 5,981,995 * | 11/1999 | Selcuk | 257/330 |
| 6,066,869 | 5/2000 | Noble et al. | 257/296 |
| 6,100,123 | 8/2000 | Bracchitta et al. | 438/199 |

OTHER PUBLICATIONS

Bomchil, G., et al., "Porous Silicon: The Material and its Applications in Silicon–on–Insulator Technologies", *Applied Surface Science, 41/42*, 604–613, (1989).

Burnett, D., et al., "Implications of Fundamental Threshold Voltage Variations for High–Density SRAM and Logic Circuits", 1994 Symposium on VLSI Technology, Digest of Technical Papers, Honolulu, HI, 15–16, (Jun. 4–7, 1994).

Burnett, D., et al., "Statistical Threshold–Voltage Variation and its Impact on Supply–Voltage Scaling", Proceedings SPIE: Microelectronic Device and Multilevel Interconnection Technology, 2636, 83–90, (1995).

Chen, M.J., et al., "Back–Gate Forward Bias Method for Low–Voltage CMOS Digital Circuits", *IEEE Transactions on Electron Devices*, 43, 904–909, (Jun. 1986).

Chen, M.J., et al., "Optimizing the Match in Weakly Inverted MOSFET's by Gated Lateral Bipolar Action", *IEEE Transactions on Electron Devices*, 43, 766–773, (May 1996).

Chung, I.Y., et al., "A New SOI Inverter for Low Power Applications", Proceedings of the 1996 IEEE International SOI Conference, Sanibel Island, FL, 20–21, (Sep. 30–Oct. 3, 1996).

De, V.K., et al., "Random MOSFET Parameter Fluctuation Limits to Gigascale Integration (GSI)", 1996 Symposium on VLSI Technology, Digest of Technical Papers, Honolulu, HI, 198–199, (Jun. 11–13, 1996).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17, 509–511, (Nov. 1996).

Fong, Y., et al., "Oxides Grown on Textured Single–Crystal Silicon—Dependence on Process and Application in EEPROMs", *IEEE Transactions on Electron Devices*, 37, 583–590, (Mar. 1990).

Fuse, T., et al., "A 0.5V 200MHz 1–Stage 32b ALU Using a Body Bias Controlled SOI Pass–Gate Logic", 1997 IEEE International Solid–State Circuits Conference, Digest of Technical Papers, 286–287, (1997).

Gong, S., et al., "Techniques for Reducing Switching Noise in High Speed Digital Systems", Proceedings of the 8th Annual IEEE International ASIC Conference and Exhibit, 21–24, (1995).

Hao, M.Y., et al., "Electrical Characteristics of Oxynitrides Grown on Textured Single–Crystal Silicon", *Appl. Phys. Lett.*, 60, 445–447, (Jan. 1992).

Harada, M., et al., "Suppression of Threshold Voltage Variation in MTCMOS/SIMOX Circuit Operating Below 0.5 V", 1996 Symposium on VLSI Technology, Digest of Technical Papers, Honolulu, HI, 96–97, (Jun. 11–13, 1996).

Hisamoto, D., et al. ,"A New Stacked Cell Structure for Giga–Bit DRAMs using Vertical Ultra–Thin SOI (Delta) MOSFETs", *1991 IEEE International Electron Devices Meeting, Technical Digest*, Washington, D.C., 959–961, (Dec. 8–11, 1991).

Hodges, D.A., et al., "MOS Decoders", In: *Analysis and Design of Digital Integrated Circuits, 2nd Edition*, McGraw–Hill Book Co., New York, 354–357, (1988).

Holman, W.T., et al., "A Compact Low Noise Operational Amplifier for a 1.2 βm Digital CMOS Technology", *IEEE Journal of Solid–State Circuits*, 30, 710–714, (Jun. 1995).

Hu, G., et al., "Will Flash Memory Replace Hard Disk Drive?", *1994 IEEE International Electron Device Meeting*, Panel Discussion, Session 24, Outline, 1 p., (Dec. 13, 1994).

Huang, W.L., et al., "TFSOI Complementary BiCMOS Technology for Low Power Applications", *IEEE Transactions on Electron Devices*, 42, 506–512, (Mar. 1995).

Jun, Y.K., et al., "The Fabrication and Electrical Properties of Modulated Stacked Capacitor for Advanced DRAM Applications", *IEEE Electron Device Letters*, 13, 430–432, (Aug. 1992).

Jung, T.S., et al., "A 117–mm$^2$ 3.3–V Only 128–Mb Multilevel NAND Flash Memory for Mass Storage Applications", *IEEE Journal of Solid–State Circuits*, 31, 1575–1582, (Nov. 1996).

Kang, H.K., et al., "Highly Manufacturable Process Technology for Reliable 256 Mbit and 1Gbit DRAMs", *IEEE International Electron Devices Meeting, Technical Digest*, San Francisco, CA, 635–638, (Dec. 11–14, 1994).

Kim, Y.S., et al., "A Study on Pyrolysis DMEAA for Selective Deposition of Aluminum", *In: Advanced Metallization and Interconnect Systems for ULSI Applications in 1995*, R.C. Ellwanger, et al., (eds.), Materials Research Society, Pittsburgh, PA, 675–680, (1996).

Kishimoto, T., et al., "Well Structure by High–Energy Boron Implantation for Soft–Error Reduction in Dynamic Random Access Memories (DRAMs)", *Japanese Journal of Applied Physics*, 34, 6899–6902, (Dec. 1995).

Kohyama, Y., et al., "Buried Bit–Line Cell for 64MB DRAMs", 1990 Symposium on VLSI Technology, Digest of Technical Papers, Honolulu, HI, 17–18, (Jun. 4–7, 1990).

Koshida, N., et al., "Efficient Visible Photoluminescence from Porous Silicon", *Japanese Journal of Applied Physics*, 30, L1221–L1223, (Jul. 1991).

Kuge, S., et al., "SOI–DRAM Circuit Technologies for Low Power High Speed Multigiga Scale Memories", *IEEE Journal of Solid–State Circuits*, 31, 586–591, (Apr. 1996).

Lantz, II, L., "Soft Errors Induced By Alpha Particles", *IEEE Transactions on Reliability*, 45, 174–179, (Jun. 1996).

Lehmann, V., "The Physics of Macropore Formation in Low Doped n–Type Silicon", *J. Electrochem. Soc.*, 140, 2836–2843, (Oct. 1993).

Lu, N., et al., "The SPT Cell—A New Substrate–Plate Trench Cell for DRAMs", *1985 IEEE International Electron Devices Meeting, Technical Digest*, Washington, D.C., 771–772, (Dec. 1–4, 1985).

MacSweeney, D., et al., "Modelling of Lateral Bipolar Devices in a CMOS Process", *IEEE Bipolar Circuits and Technology Meeting*, Minneapolis, MN, 27–30, (Sep. 1996).

Maeda, S., et al., "A Vertical Θ–Shape Transistor (VΘT) Cell for 1 Gbit DRAM and Beyond", 1994 Symposium of VLSI Technology, Digest of Technical Papers, Honolulu, HI, 133–134, (Jun. 7–9, 1994).

Maeda, S., et al., "Impact of a Vertical Θ–Shape Transistor (VΘT) Cell for 1 Gbit DRAM and Beyond", *IEEE Transactions on Electron Devices*, 42, 2117–2123, (Dec. 1995).

Malaviya, S., *IBM TBD*, 15, p. 42, (Jul. 1972).

Nitayama, A., et al., "High Speed and Compact CMOS Circuits with Multipillar Surrounding Gate Transistors", *IEEE Transactions on Electron Devices*, 36, 2605–2606, (Nov. 1989).

Ohno, Y., et al., "Estimation of the Charge Collection for the Soft–Error Immunity by the 3D–Device Simulation and the Quantitative Investigation", *Simulation of Semiconductor Devices and Processes*, 6, 302–305, (Sep. 1995).

Oowaki, Y., et al., "New α–Particle Induced Soft Error Mechanism in a Three Dimensional Capacitor Cell", *IEICE Transactions on Electronics*, 78–C, 845–851, (Jul. 1995).

Oshida, S., et al., "Minority Carrier Collection in 256 M–bit DRAM Cell on Incidence of Alpha–Particle Analyzed by Three–Dimensional Device Simulation", *IEICE Transactions on Electronics*, 76–C, 1604–1610, (Nov. 1993).

Ozaki, T., et al., "A Surrounding Isolation–Merged Plate Electrode (SIMPLE) Cell with Checkered Layout for 256Mbit DRAMs and Beyond", *1991 IEEE International Electron Devices Meeting*, Washington, D.C., 469–472, (Dec. 8–11, 1991).

Parke, S.A., et al., "A High–Performance Lateral Bipolar Transistor Fabricated on SIMOX", *IEEE Electron Device Letters*, 14, 33–35, (Jan. 1993).

Pein, H., et al., "A 3–D Sidewall Flash EPROM Cell and Memory Array", *IEEE Transactions on Electron Devices*, 40, 2126–2127, (Nov. 1993).

Pein, H., et al., "Performance of the 3–D Pencil Flash EPROM Cell and Memory Array", *IEEE Transactions on Electron Devices*, 42, 1982–1991, (Nov., 1995).

Pein, H.B., et al., "Performance of the 3–D Sidewall Flash EPROM Cell", *IEEE International Electron Devices Meeting, Technical Digest*, 11–14, (1993).

Rao, K.V., et al., "Trench Capacitor Design Issues in VLSI DRAM Cells", *1986 IEEE International Electron Devices Meeting, Technical Digest*, Los Angeles, CA, 140–143, (Dec. 7–10, 1986).

Richardson, W.F., et al., "A Trench Transistor Cross–Point DRAM Cell", *1985 IEEE International Electron Devices Meeting*, Washington, D.C., 714–717, (Dec. 1–4, 1985).

Sagara, K., et al., "A 0.72 βm$^2$ Recessed STC (RSTC) Technology for 256Mbit DRAMs using Quarter–Micron Phase–Shift Lithography", *1992 Symposium on VLSI Technology, Digest of Technical Papers*, Seattle, WA, 10–11, (Jun. 2–4, 1992).

Saito, M., et al., "Technique for Controlling Effective Vth in Multi–Gbit DRAM Sense Amplifier", 1996 Symposium on VLSI Circuits, Digest of Technical Papers, Honolulu, HI, 106–107, (Jun. 13–15, 1996).

Shah, A.H., et al., "A 4–Mbit DRAM with Trench–Transistor Cell", *IEEE Journal of Solid–State Circuits, SC–21*, 618–625, (Oct. 1986).

Shah, A.H., et al., "A 4Mb DRAM with Cross–Point Trench Transistor Cell", 1986 IEEE International Solid–State Circuits Conference, Digest of Technical Papers, 268–269, (Feb. 21, 1986).

Sherony, M.J., et al., "Reduction of Threshold Voltage Sensitivity in SOI MOSFET's", *IEEE Electron Device Letters*, 16, 100–102, (Mar. 1995).

Shimomura, K., et al., "A 1V 46ns 16Mb SOI–DRAM with Body Control Technique", 1997 IEEE International Solid–State Circuits Conference, Digest of Technical Papers, 68–69, (Feb. 6, 1997).

Stellwag, T.B., et al., "A Vertically–Integrated GaAs Bipolar DRAM Cell", *IEEE Transactions on Electron Devices*, 38, 2704–2705, (Dec. 1991).

Suma, K., et al., "An SOI–DRAM with Wide Operating Voltage Range by CMOS/SIMOX Technology", *IEEE Journal of Solid–State Circuits*, 29, 1323–1329, (Nov. 1994).

Sunouchi, K., et al., "A Surrounding Gate Transistor (SGT) Cell for 64/256Mbit DRAMs", *1989 IEEE International Electron Devices Meeting, Technical Digest*, Washington, D.C., 23–26, (Dec. 3–6, 1989).

Sunouchi, K., et al., "Process Integration for 64M DRAM Using an Asymmetrical Stacked Trench Capacitor (AST) Cell", *1990 IEEE International Electron Devices Meeting*, San Francisco, CA, 647–650, (Dec. 9–12, 1990).

Takai, M., et al., "Direct Measurement and Improvement of Local Soft Error Susceptibility in Dynamic Random Access Memories", *Nuclear Instruments & Methods in Physics Research, B–99*, Proceedings of the 13th International Conference on the Application of Accelerators in Research and Industry, Denton, TX, 562–565, (Nov. 7–10, 1994).

Takato, H., et al., "High Performance CMOS Surrounding Gate Transistor (SGT) for Ultra High Density LSIs", *1988 IEEE International Electron Devices Meeting, Technical Digest*, 222–225, (1988).

Takato, H., et al., "Impact of Surrounding Gate Transistor (SGT) for Ultra–High Density LSI's", *IEEE Transactions on Electron Devices*, 38, 573–578, (Mar. 1991).

Tanabe, N., et al., "A Ferroelectric Capacitor Over Bit–Line (F–COB) Cell for High Density Nonvolatile Ferroelectric Memories", 1995 Symposium on VLSI Technology, Digest of Technical Papers, Kyoto, Japan, 123–124, (Jun. 6–8, 1995).

Temmler, D., "Multilayer Vertical Stacked Capacitors (MVSTC) for 64Mbit and 256Mbit DRAMs", 1991 Symposium on VLSI Technology, Digest of Technical Papers, Oiso, 13–14, (May 28–30, 1991).

Terauchi, M., et al., "A Surrounding Gate Transistor (SGT) Gain Cell for Ultra High Density DRAMs", 1993 Symposium on VLSI Technology, Digest of Technical Papers, Kyoto, Japan, 21–22, (1993).

Tsui, P.G., et al., "A Versatile Half–Micron Complementary BiCMOS Technology for Microprocessor–Based Smart Power Applications", *IEEE Transactions on Electron Devices*, 42, 564–570, (Mar. 1995).

Verdonckt–Vandebroek, S., et al., "High–Gain Lateral Bipolar Action in a MOSFET Structure", *IEEE Transactions on Electron Devices*, 38, 2487–2496, (Nov. 1991).

Wang, N., *Digital MOS Integrated Circuits*, Prentice Hall, Inc., Englewood Cliffs, NJ, p. 328–333, (1989).

Wang, P.W., et al., "Excellent Emission Characteristics of Tunneling Oxides Formed Using Ultrathin Silicon Films for Flash Memory Devices", *Japanese Journal of Applied Physics*, 35, 3369–3373, (Jun. 1996).

Watanabe, H., et al., "A New Cylindrical Capacitor Using Hemispherical Grained Si (HSG–Si) for 256Mb DRAMs", *IEEE International Electron Devices Meeting, Technical Digest*, San Francisco, CA, 259–262, (Dec. 13–16, 1992).

Watanabe, H., et al., "A Novel Stacked Capacitor with Porous–Si Electrodes for High Density DRAMs", 1993 Symposium on VLSI Technology, Digest of Technical Papers, Kyoto, Japan, 17–18, (1993).

Watanabe, H., et al., "An Advanced Fabrication Technology of Hemispherical Grained (HSG) Poly–Si for High Capacitance Storage Electrodes", Extended Abstracts of the 1991 International Conference on Solid State Devices and Materials, Yokohama, Japan, 478–480, (1991).

Watanabe, H., et al., "Device Application and Structure Observation for Hemispherical–Grained Si", *J. Appl. Phys.*, 71, 3538–3543, (Apr. 1992).

Watanabe, H., et al., "Hemispherical Grained Silicon (HSG–Si) Formation on In–Situ Phosphorous Doped Amorphous–Si Using the Seeding Method", Extended Abstracts of the 1992 International Conference on Solid State Devices and Materials, Tsukuba, Japan, 422–424, (1992).

Watanabe, S., et al., "A Novel Circuit Technology with Surrounding Gate Transistors (SGT's) for Ultra High Density DRAM's", *IEEE Journal of Solid–State Circuits*, 30, 960–971, (Sep. 1995).

Yamada, T., et al., "A New Cell Structure with a Spread Source/Drain (SSD) MOSFET and a Cylindrical Capacitor for 64–Mb DRAM's", *IEEE Transactions on Electron Devices*, 38, 2481–2486, (Nov. 1991).

Yamada, T., et al., "Spread Source/Drain (SSD) MOSFET Using Selective Silicon Growth for 64Mbit DRAMs", *1989 IEEE International Electron Devices Meeting, Technical Digest*, Washington, D.C., 35–38, (Dec. 3–6, 1989).

Yoshikawa, K., "Impact of Cell Threshold Voltage Distribution in the Array of Flash Memories on Scaled and Multilevel Flash Cell Design", 1996 Symposium on VLSI Technology, Digest of Technical Papers, Honolulu, HI, 240–241, (Jun. 11–13, 1996).

Sun, J., "CMOS Technology for 1.8V and Beyond", Int'l Symp. on VLSI Technology, Systems and Applications: Digest of Technical Papers, 293–297, (1997).

Takao, Y., et al., "A 4–$\mu m^2$ Full–CMOS SRAM Cell Technology for 0.2–$\mu m$ High Performance Logic LSIs", 1997 Symp. on VLSI Technology: Digest of Technical Papers, Kyoto, Japan, 11–12, (1997).

\* cited by examiner

CIRCUITS AND METHODS FOR A STATIC RANDOM ACCESS MEMORY USING VERTICAL TRANSISTORS

FIELD OF THE INVENTION

The present invention relates generally to semiconductor integrated circuit More particularly, it pertains to circuits and methods for a static random access memory using vertical transistors.

BACKGROUND OF THE INVENTION

Modem electronic systems typically include a data storage device such as a dynamic random access memory (DRAM), static random access memory (SRAM) or other conventional memory device. The memory device stores data in vast arrays of memory cells. Each cell conventionally stores a single bit of data (a logical "1" or a logical "0") and can be individually accessed or addressed.

Electronic systems, e.g., computers, conventionally store data during operation in the memory device. As these systems become more sophisticated, they require more and more memory in order to keep pace with the increasing complexity of software based applications that run on the systems. Thus, as the technology relating to memory devices has evolved, designers have tried to increase the density of memory cells in the memory device. The electronics industry strives to decrease the size of the memory cells. This allows a larger number of memory cells to be fabricated without substantially increasing the size of the semiconductor wafer.

Static random access memory or "SRAM" is one type of memory device that is used with computers. Conventionally, an SRAM device includes an array of addressable memory cells. Each cell includes a four transistor flip-flop and access transistors that are coupled to input/output nodes of the flip-flop. Data is written to the memory cell by applying a high or low logic level to one of the input/output nodes of the flip-flop through one of the access transistors. When the logic level is removed from the access transistor, the flip-flop retains this logic level at the input/output node. Data is read out from the flip-flop by turning on the access transistor.

Memory devices are fabricated using photolithographic techniques that allow semiconductor and other materials to be manipulated to form integrated circuits as is known in the art. These photolithographic techniques essentially use light that is focussed through lenses to define patterns in the materials with microscopic dimensions. The equipment and techniques that are used to implement this photolithography provide a limit for the size of the circuits that can be formed with the materials. Essentially, at some point, the lithography cannot create a fine enough image with sufficient clarity to decrease the size of the elements of circuit. In other words, there is a minimum dimension that can be achieved through conventional photolithography. This minimum dimension is referred to as the "critical dimension" (CD) or minimum feature size (F) of the photolithographic process.

The minimum feature size imposes one constraint on the size of conventional SRAM memory cells. Conventionally, SRAM cells have used a surface area on a substrate that is approximately equal to 120 feature squares. Recently, researchers have designed an SRAM cell in an area of approximately 100 feature squares. In order to keep up with the demands for higher capacity memory devices, designers need to further reduce the size of the memory cells.

For the reasons stated above, and for other reasons stated below which will become apparent to those skilled in the art upon reading and understanding the present specification, there is a need in the art for an SRAM cell which uses less surface area than conventional SRAM cells.

SUMMARY OF THE INVENTION

The above mentioned problems with memory devices and other problems are addressed by the present invention and will be understood by reading and studying the following specification. A circuit and method for a static random access memory cell are described which use vertical transistors with a surface area of approximately 32 feature squares ("$F^2$") to implement a six transistor cell.

In particular, an illustrative embodiment of the present invention includes a memory cell. The memory cells has a flip-flop that includes a cross-coupled pair of inverters. The inverters each include a pair of complementary, vertical transistors. A gate contact interconnects the gates of the inverters and acts as the input of the inverter. A shunt interconnects a first source/drain region of the complementary transistors and acts as the output of the inverter. A first vertical, access transistor is also included. The first vertical, access transistor has a gate that is coupled to a word line, a first source/drain region that is coupled to the output of one of the inverters, and a second source/drain region that is coupled to a first bit line. A second vertical, access transistor is also provided. The second vertical, access transistor has a gate that is coupled to the word line, a first source/drain region that is coupled to the output of the other inverter, and a second source/drain region that is coupled to a second bit line.

In another embodiment, a method for forming a memory cell is provided. The method includes forming vertical bars of semiconductor material on a surface of a semiconductor wafer. The bars have vertically aligned first source/drain, body and second source/drain regions. Individual pillars of semiconductor material are separated out from the vertical bars to form vertical transistors. Vertical transistors from adjacent bars with body regions of different conductivity types are coupled to form inverters. The inverters are cross-coupled to form an array of flip-flops. Vertical access transistors are coupled to inputs/outputs of the flip-flops.

In another embodiment, an electronic system is provided. The electronic system includes a microprocessor. The microprocessor is coupled to a static random access memory. The memory has an array of six-transistor memory cells. Each memory cell is formed with six vertical transistors on a surface area of approximately 32 feature (F) squares.

In another embodiment, a memory device is provided. The memory device includes a number of word lines and a number bit lines that are disposed to form an array. A number of memory cells are addressably disposed at intersections of word and bit lines. Each memory cell includes a cross-coupled pair of inverters that are formed from vertical transistors. Each memory cell also includes a pair of vertical, access transistors that are each coupled to the output of one of the inverters. Each vertical, access transistor in a memory cell is coupled to a selected word line and a selected bit line. A word line decoder is coupled to the word lines of the memory array and selectively activates the word lines of the array. A sense amplifier is coupled to the bit lines of the array of memory cells. A bit line decoder is coupled to the sense amplifier and selects bit lines for reading and writing data to and from the memory cells.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Figure 1:
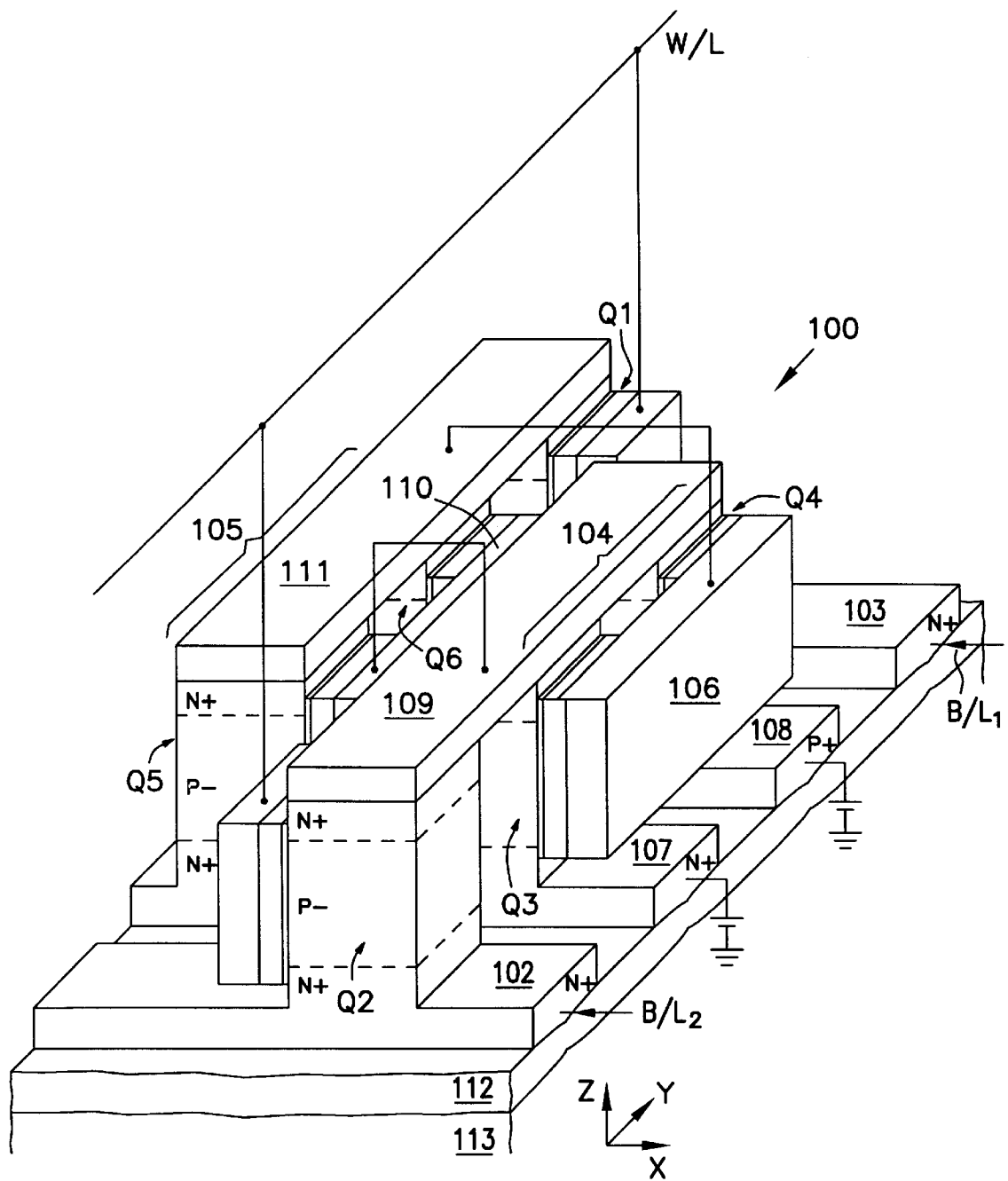
FIG. 1 is a perspective view illustrating generally an embodiment of a portion of a static random access memory array according to the teachings of the present invention.

FIG. 1 is a perspective view illustrating generally an embodiment of a portion of a static random access memory array according to the teachings of the present invention. Specifically, memory cell 100 is a six transistor memory cell that is formed using, for example, the technique described below with respect to FIGS. 4A through 4P. Each transistor in memory cell 100 is formed in a vertical pillar of single crystalline semiconductor material, e.g., silicon. In this embodiment, memory cell 100 is formed on a semiconductor-on-insulator (SOI) structure that includes substrate 113 and insulator layer 112.

Memory cell 100 includes transistors $Q_1$ and $Q_2$ which act as access transistors for memory cell 100. Transistors $Q_1$ and $Q_2$ are n-channel metal-oxide-semiconductor (MOS) transistors each with vertically aligned n+ source/drain regions and a p- body region. Transistors $Q_1$ and $Q_2$ are formed in a pillar of semiconductor material that extends outwardly from n+ rails 102 and 103, respectively. Throughout this specification the designation "n+" refers to semiconductor material that is heavily doped n type semiconductor material, e.g., monocrystalline silicon or polycrystalline silicon. Similarly, the designation "p+" refers to semiconductor material that is heavily material. The designations "n−" and "p−" refer to lightly doped n and p type semiconductor materials, respectively. Rails 102 and 103 act as the bit lines (B/L$_1$ and B/L$_2$, respectively) for memory cell 100 and are formed integrally with one of the n+ source drain regions of the access transistors. The gates of transistors $Q_1$ and $Q_2$ are coupled to wordline, W/L.

Memory cell 100 also includes a flip-flop formed of cross-coupled inverters 104 and 105. Inverter 104 comprises the combination of vertical transistors $Q_3$ and $Q_4$. The gates of transistors $Q_3$ and $Q_4$ are coupled together by gate contact 106. Gate contact 106 is disposed along a side of transistors $Q_3$ and $Q_4$. Transistor $Q_3$ is a n-channel transistor and transistor $Q_4$ is a p-channel transistor. Transistors $Q_3$ and $Q_4$ are coupled to similar transistors in other cells by n+ rail 107 and p+ rail 108, respectively. Rail 107 is coupled to ground potential and rail 108 is maintained at a higher, voltage supply level. Transistors $Q_2$, $Q_3$, and $Q_4$ are coupled together with shunt 109. Similarly, transistors $Q_5$ and $Q_6$ are coupled together to form a second inverter with gate contact 110 and shunt 111. Shunt 111 also couples the inverter to access transistor $Q_1$. The inverters are cross coupled by coupling shunt 109 with gate contact 110 and coupling shunt 111 with gate contact 106.

The n-channel and p-channel transistors of memory cell 100 have gates that are formed of n+ and p+ polysilicon, respectively. The polysilicon gates in an inverter are coupled together with a gate contact that is formed of a refractory metal so as to provide a dual work function feature for desired surface channel characteristics in each transistor in the inverter. It is noted that the device bodies of the transistors in memory cell 100 are isolated from each other and the substrate such that the transistors exhibit semiconductor-on-insulator characteristics. Thus, the transistors may be filly depleted, floating body devices and no CMOS wells are needed for isolation. However, a body contact can be included using the technique of U.S. application Ser. No. 08/889,396, entitled *Memory Cell with Vertical Transistor and Buried Word and Body Lines* (the '396 Application). The '396 Application is incorporated by reference.

Figure 3:
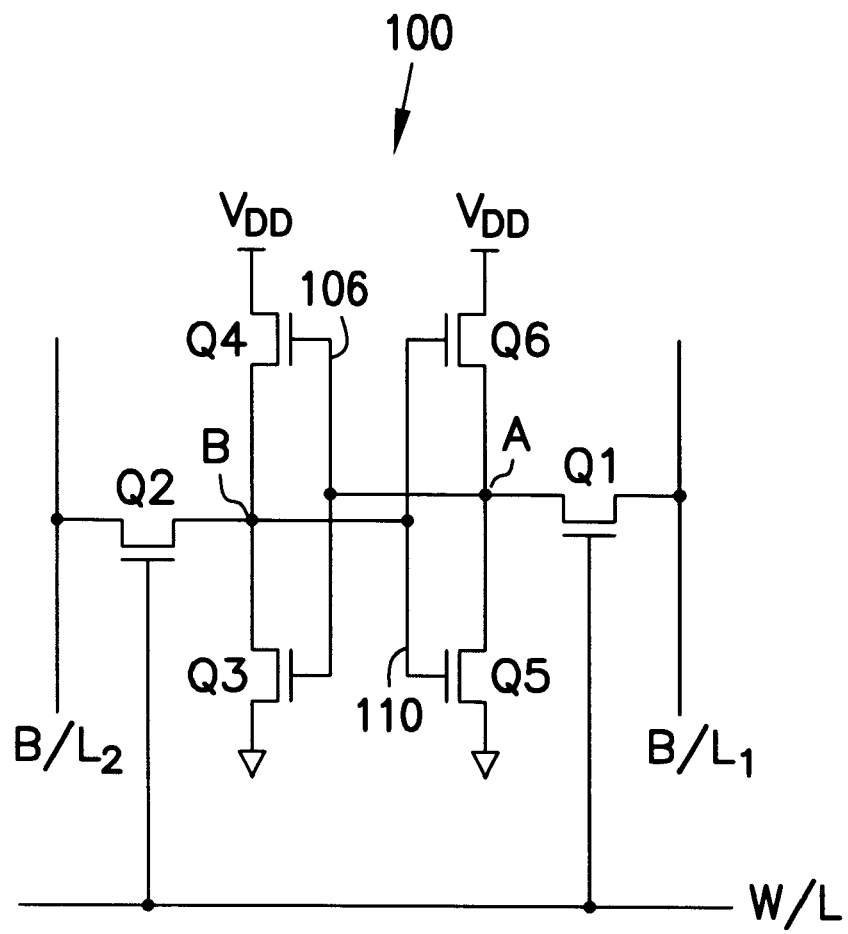
FIG. 3 is a schematic diagram of the embodiment of FIG. 1.

The operation of the embodiment of FIG. 1 is described in connection with the schematic diagram of FIG. 3. Data is written to and read from memory cell 100. For example, a low logic level is written to memory cell 100 by activating access transistor $Q_1$ with a high logic level on wordline W/L. Bit line B/L$_1$ is brought to a low logic level. Transistor $Q_1$ transmits this low logic level to inverter 105 at input/output node A (shunt 111). This low voltage is also passed to gate contact 106 of inverter 104. This turns off transistor $Q_3$ and drives input/output node B (shunt 109) to a high potential. Node B is coupled to gate contact 110 of inverter 105 so as to maintain the low logic level on the node A. Wordline W/L is then reduced to ground potential and memory cell 100 stores the low logic level in inverter 105 at node A. In a similar manner a high logic level is written to memory cell 100 by raising the bit line B/L$_1$ to a high logic level.

Data is read out of memory cell 100 by activating access transistors $Q_1$ and $Q_2$ so as to pass the voltage levels of nodes A and B to bit lines B/L$_1$ and B/L$_2$, respectively. The voltage on the bit lines is sensed to determine the stored logic level.

Figure 2:
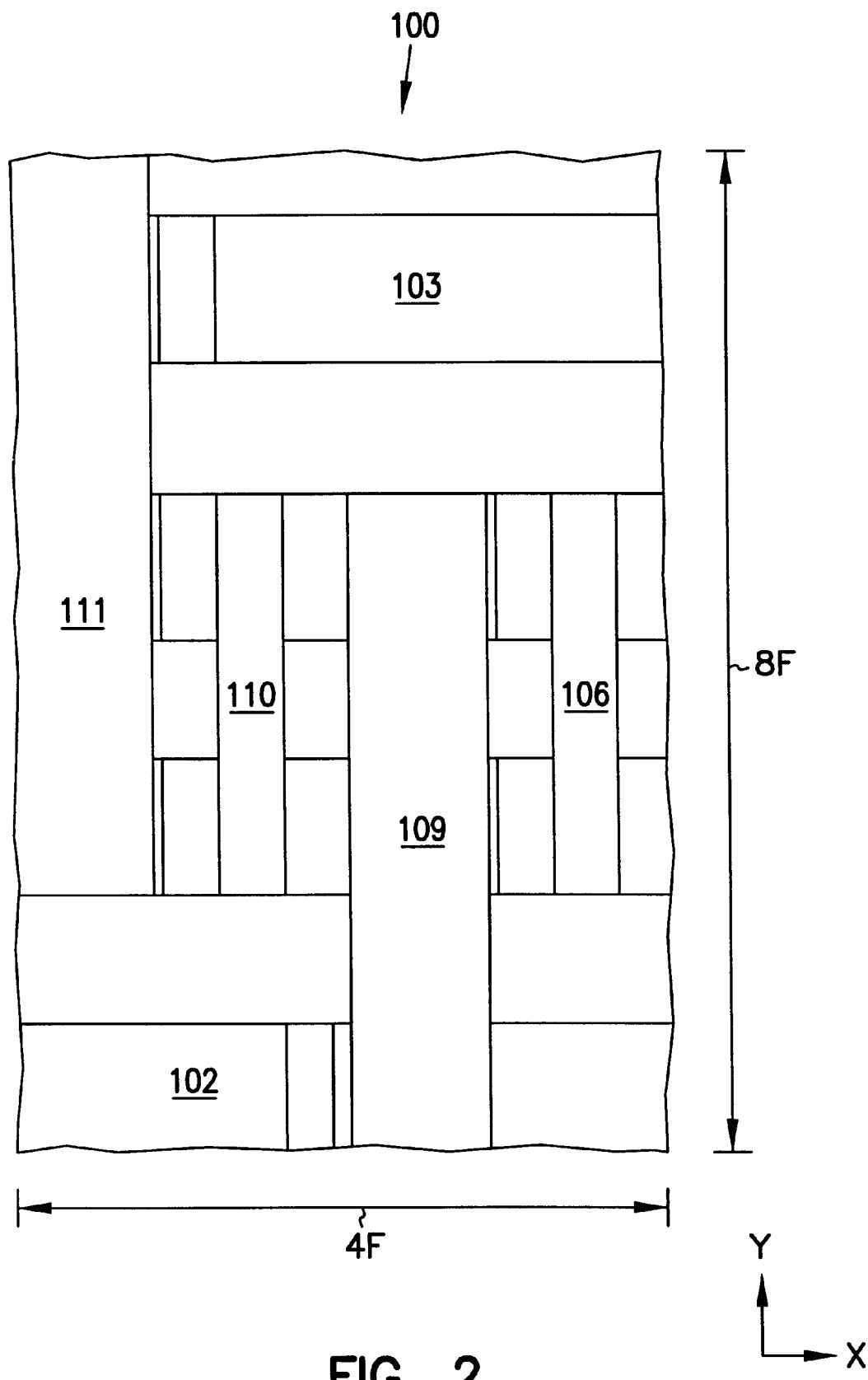
FIG. 2 is a top view of the embodiment of FIG. 1.

FIG. 2 is a top view of the embodiment of FIG. 1 that illustrates that memory cell 100 can be fabricated in a surface area of approximately 32 feature squares.

Figure 4A:
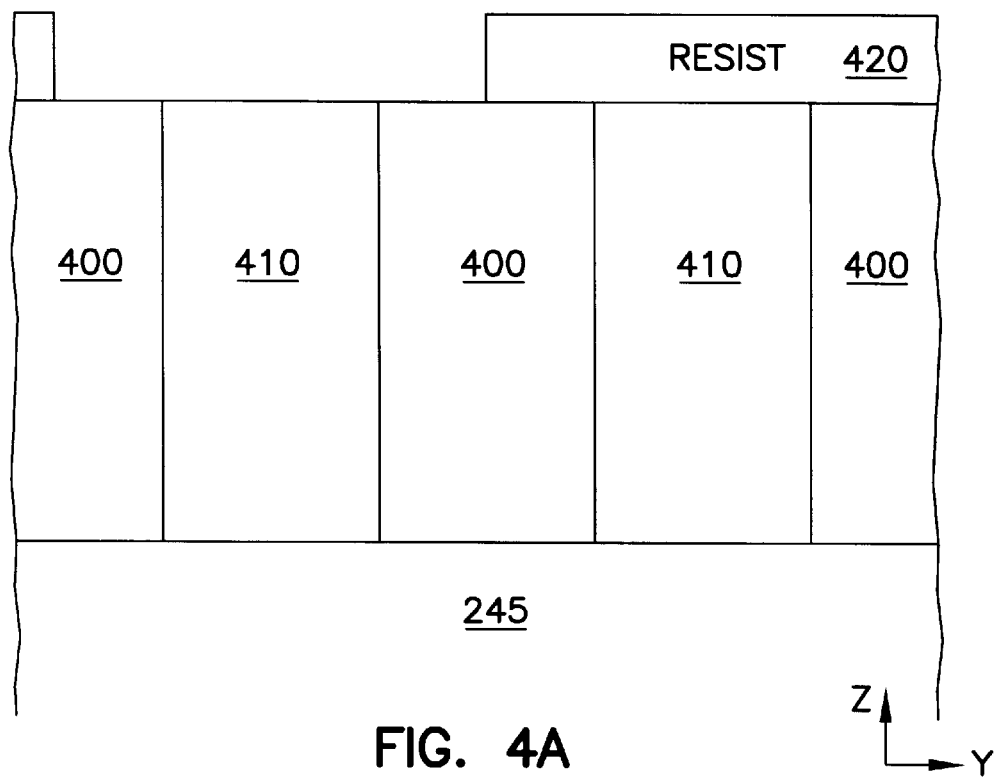
FIGS. 4A through 4P illustrate an embodiment of a process for fabricating an array for a static random access memory device according to the teachings of the present invention.
Figure 4B:
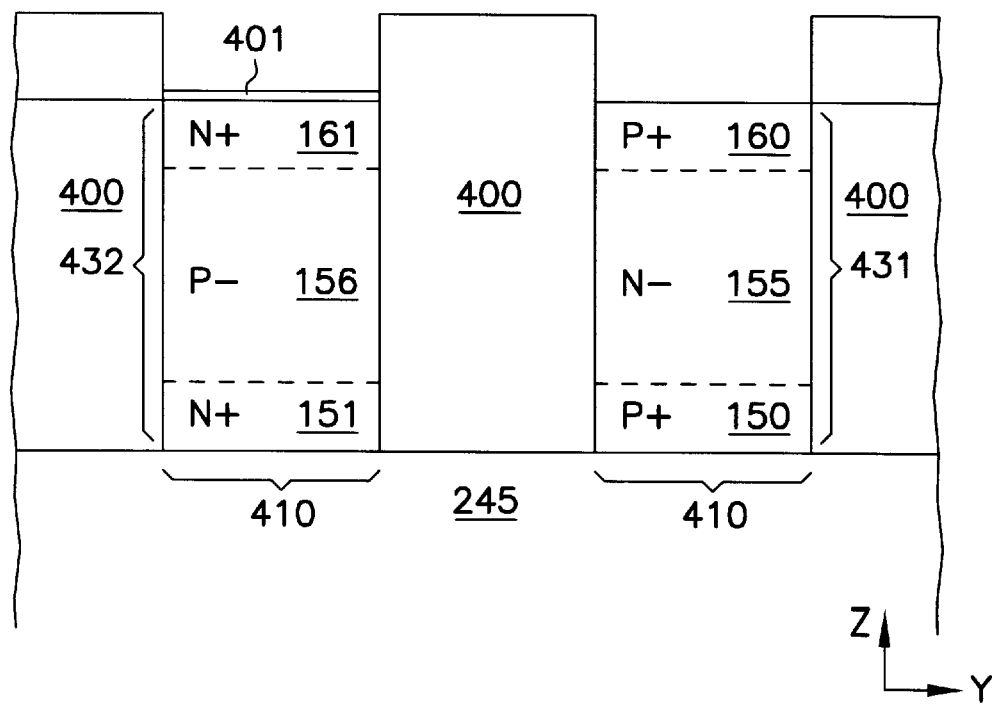
Figure 4C:
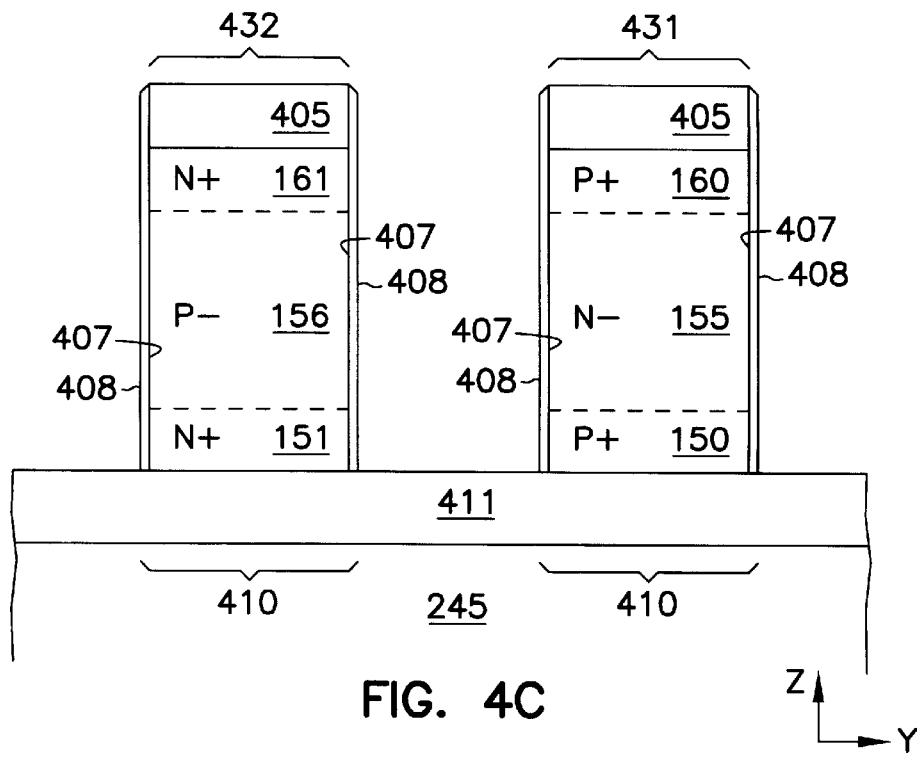
Figure 4D:
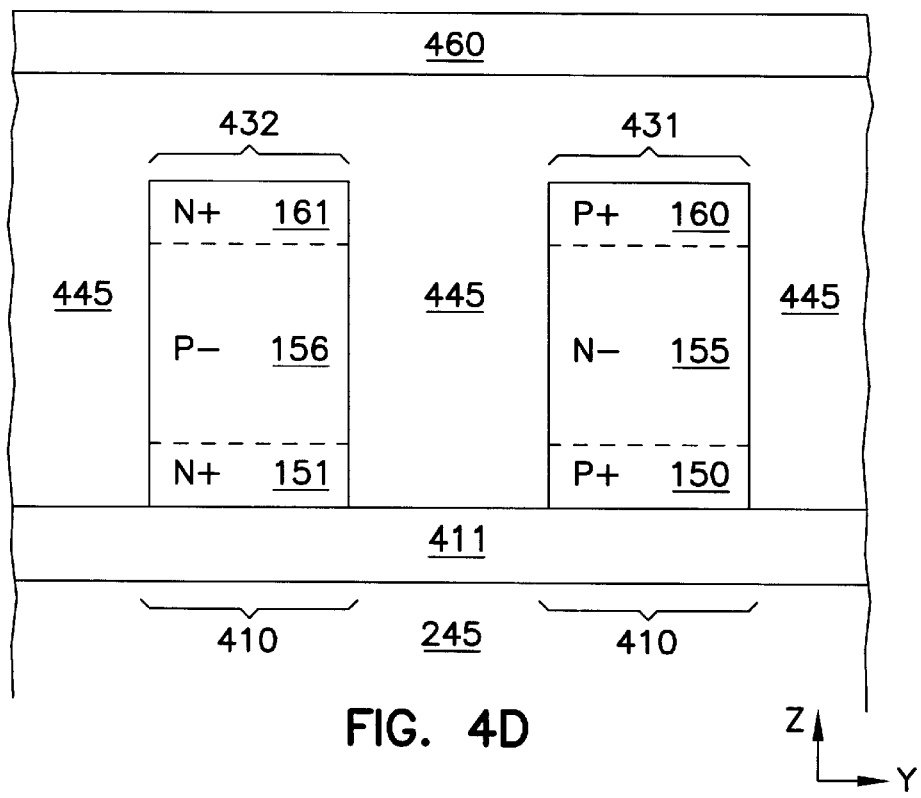
Figure 4E:
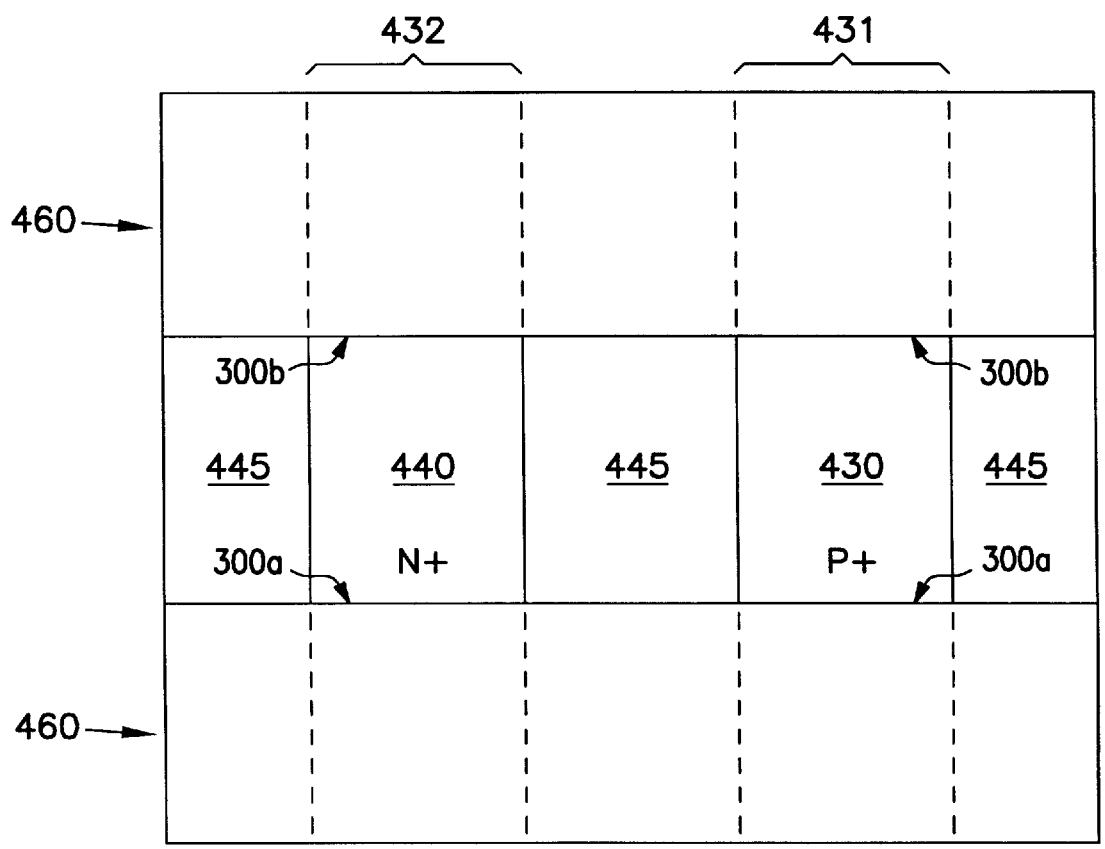
Figure 4F:
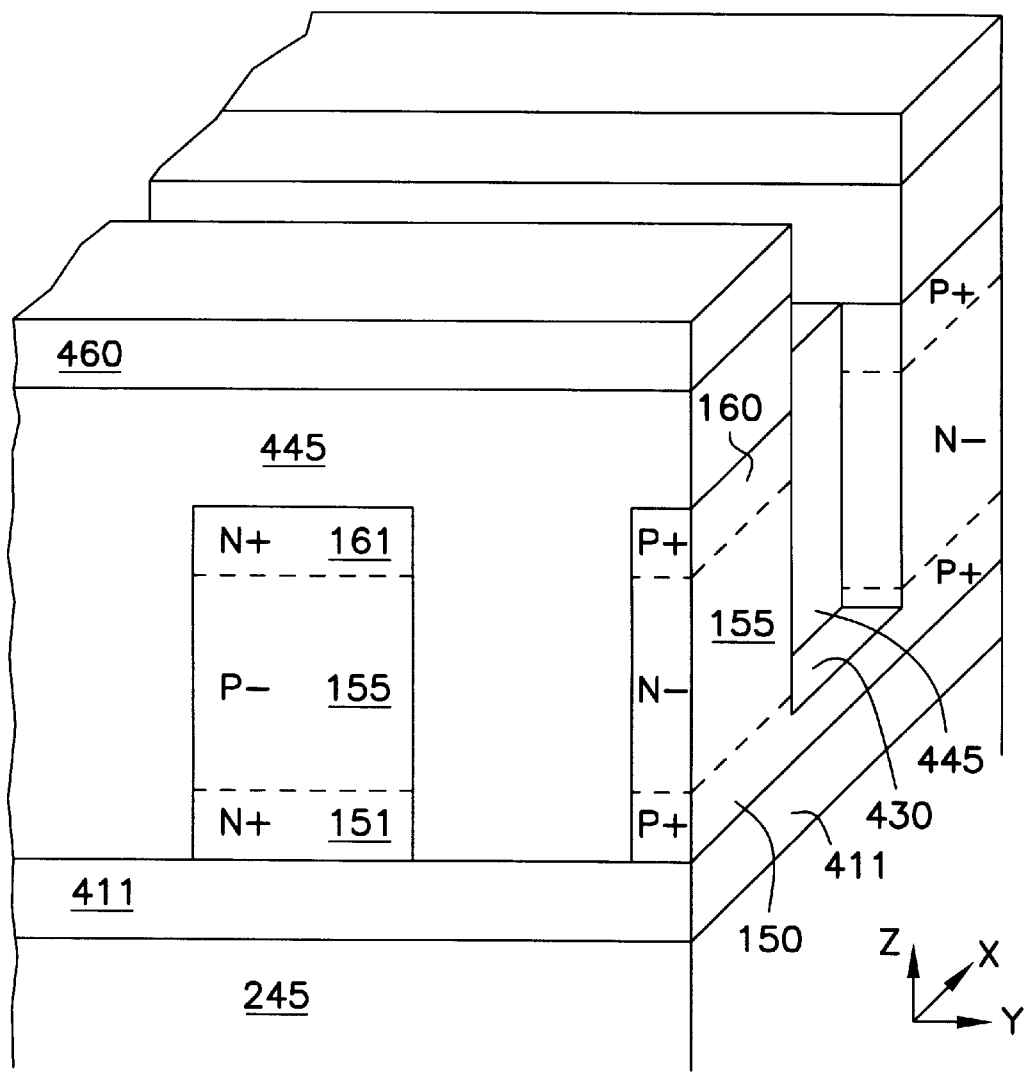
Figure 4G:
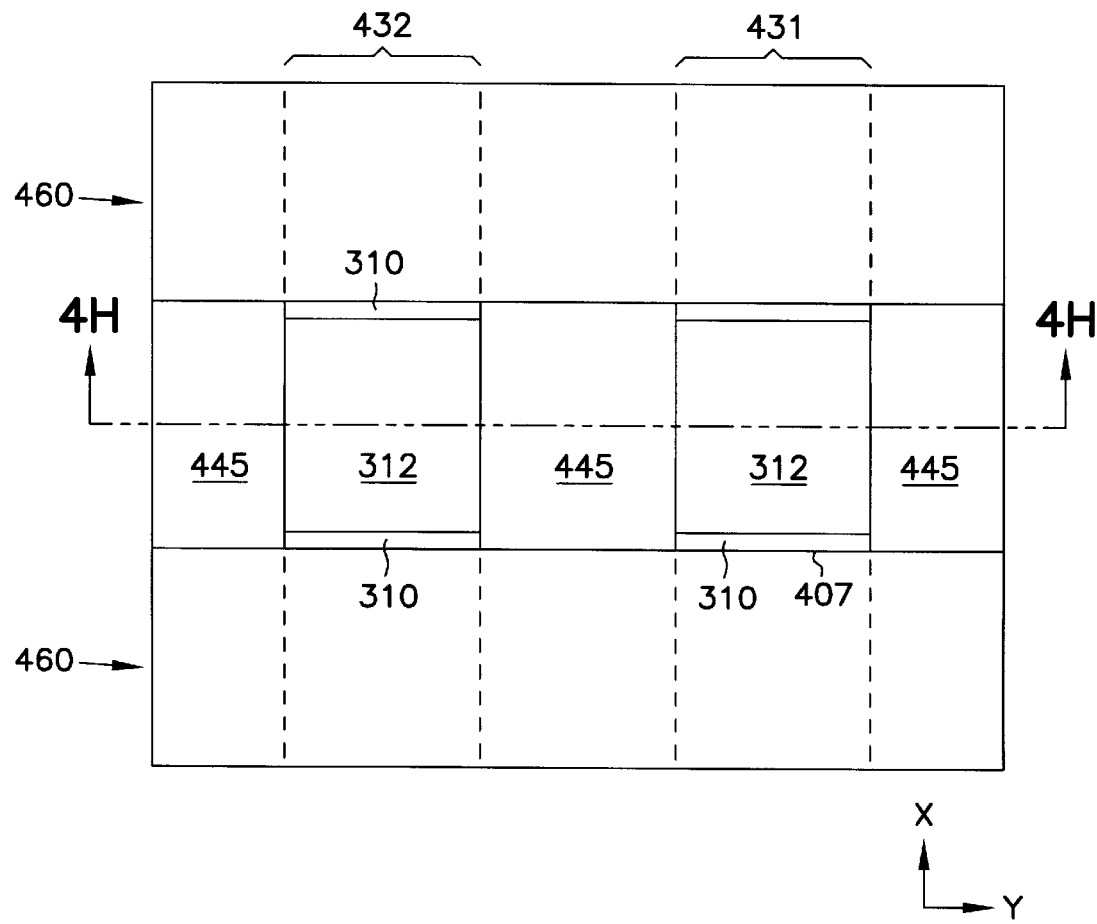
Figure 4H:
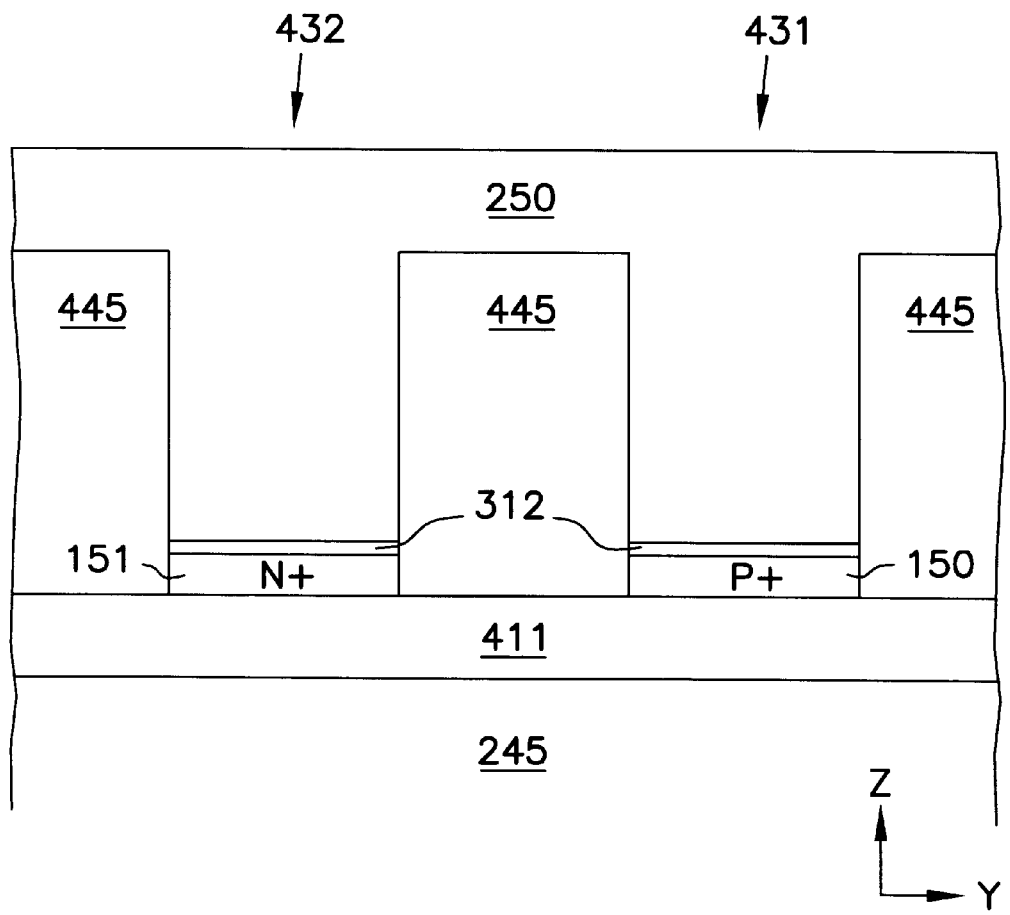
Figure 41:
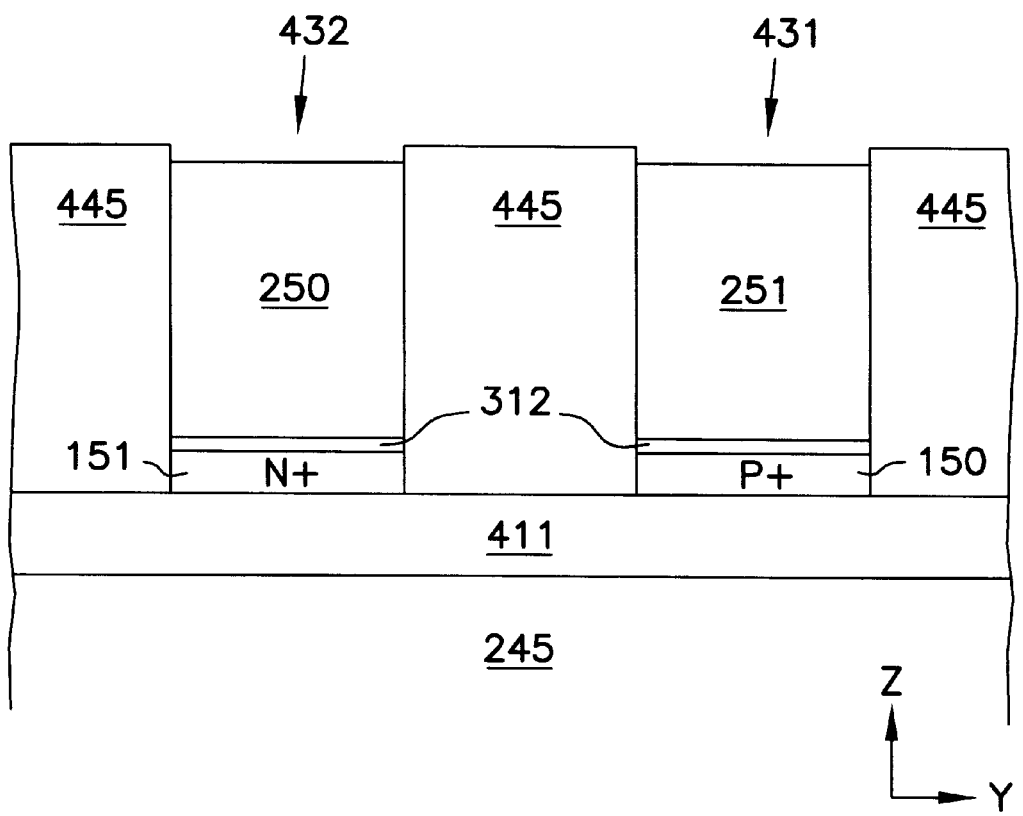
Figure 4J:
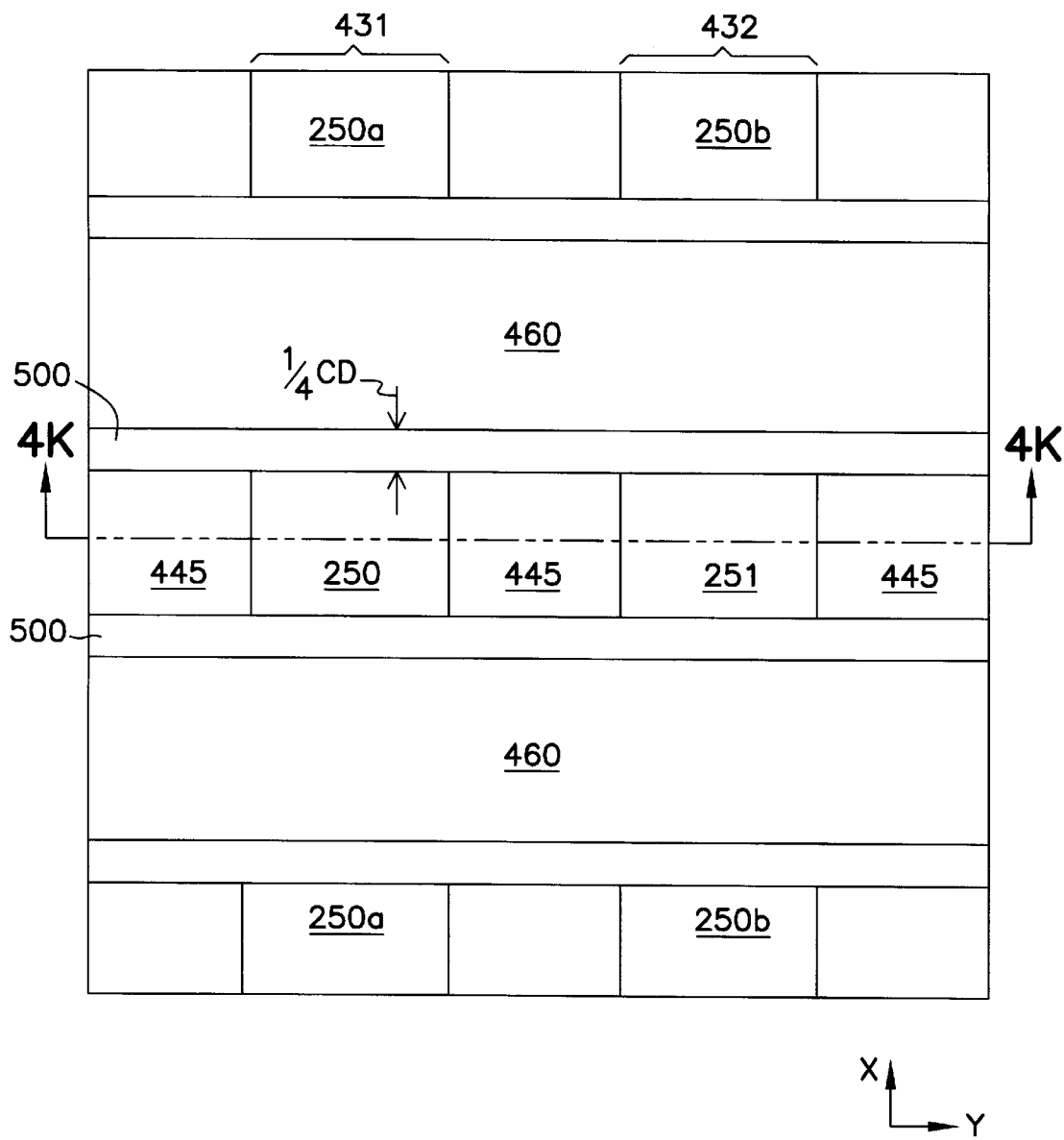
Figure 4K:
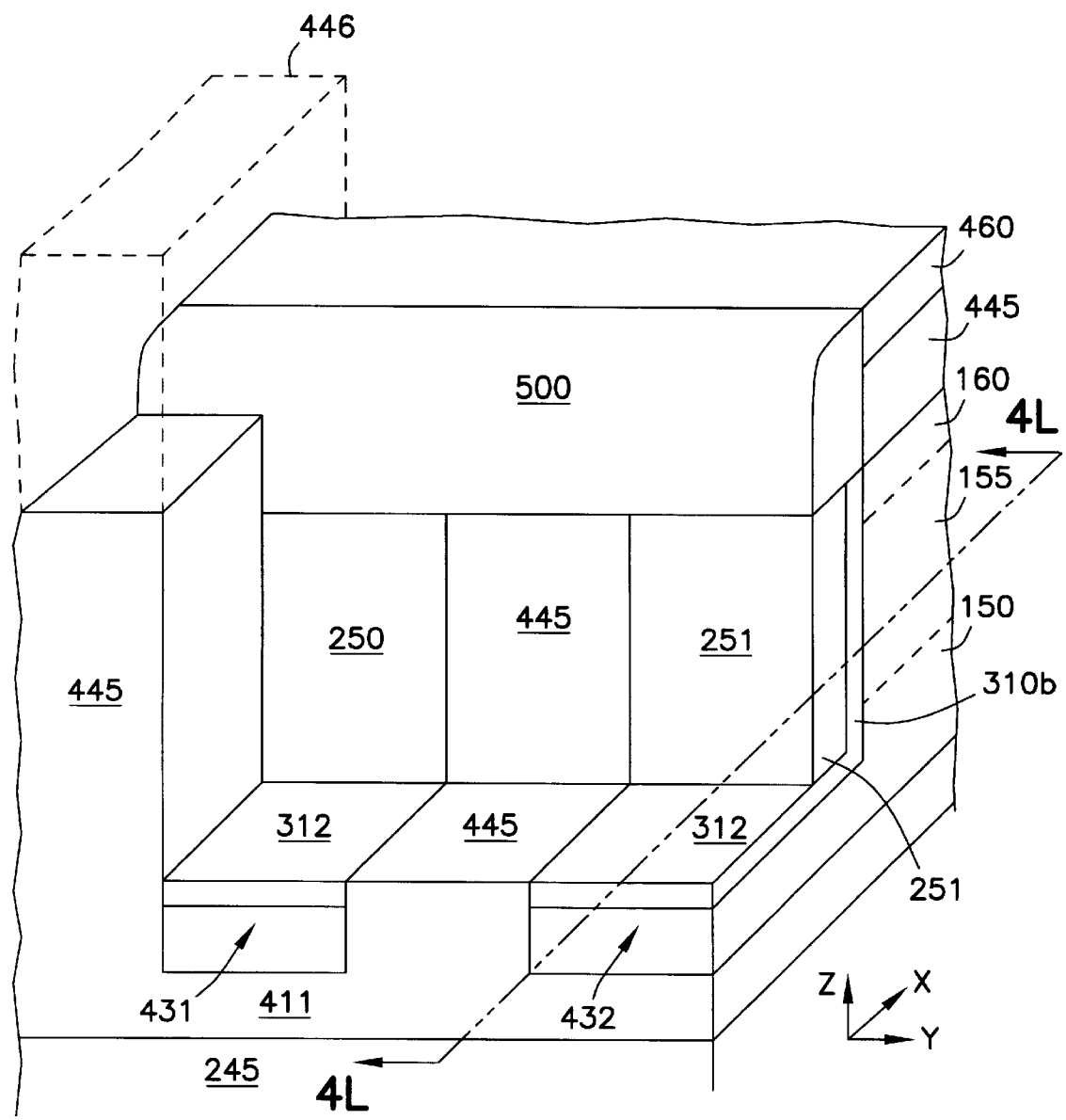
Figure 4L:
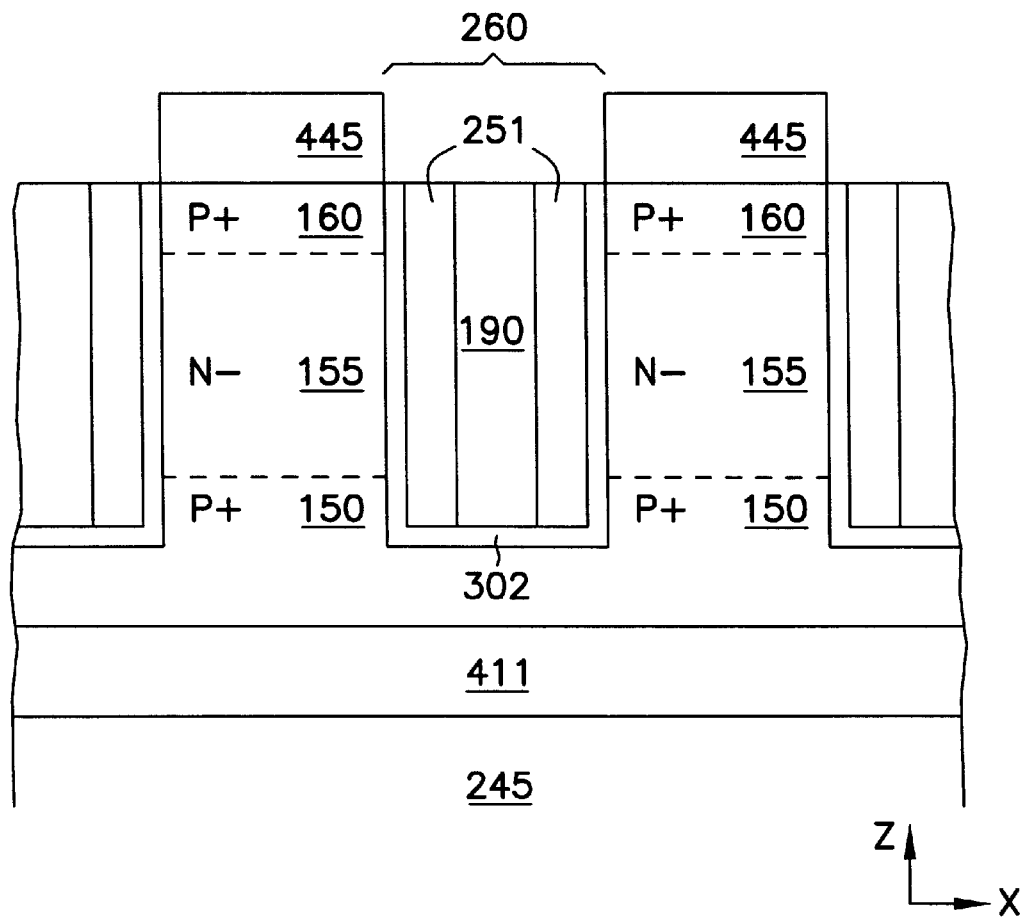
Figure 4M:
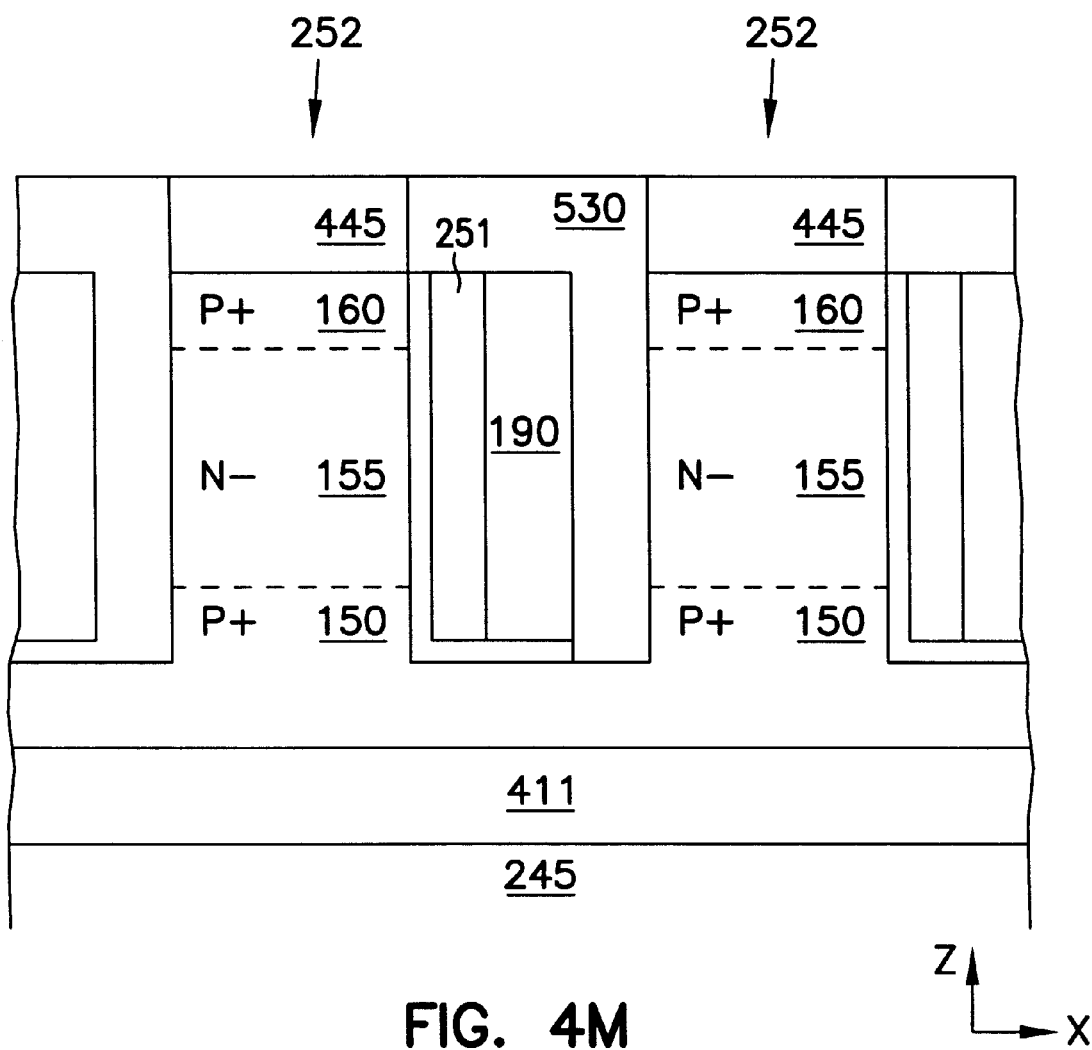
Figure 4N:
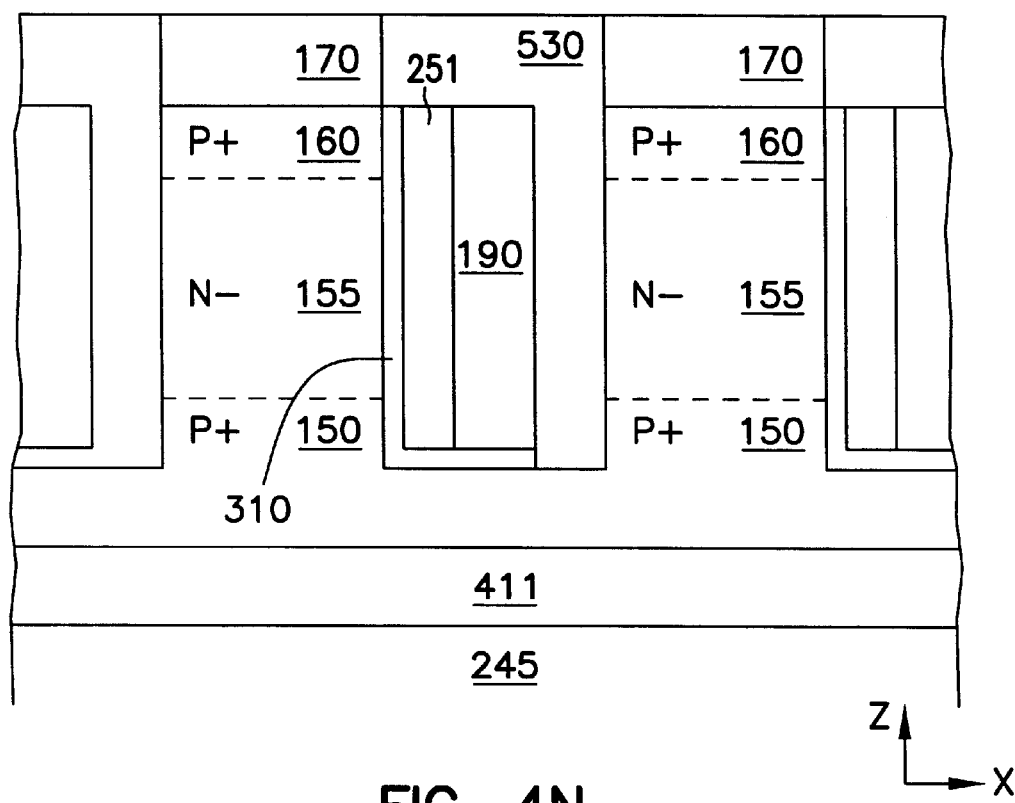
Figure 40:
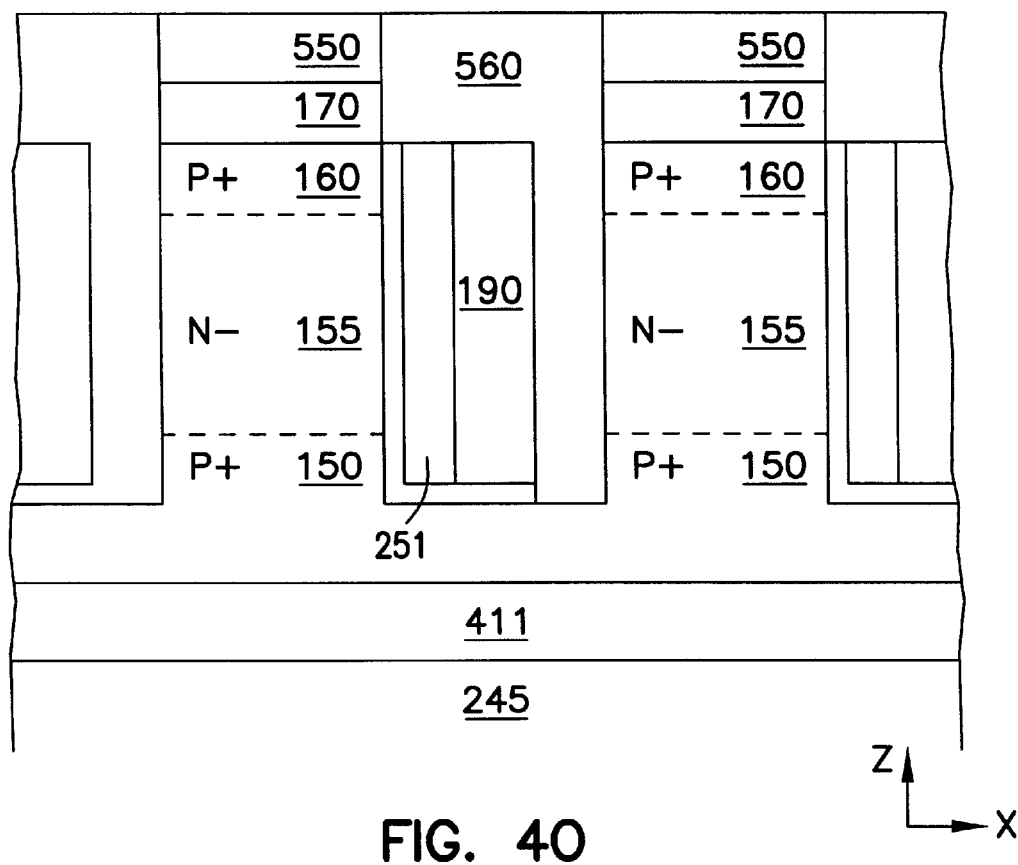
Figure 4P:
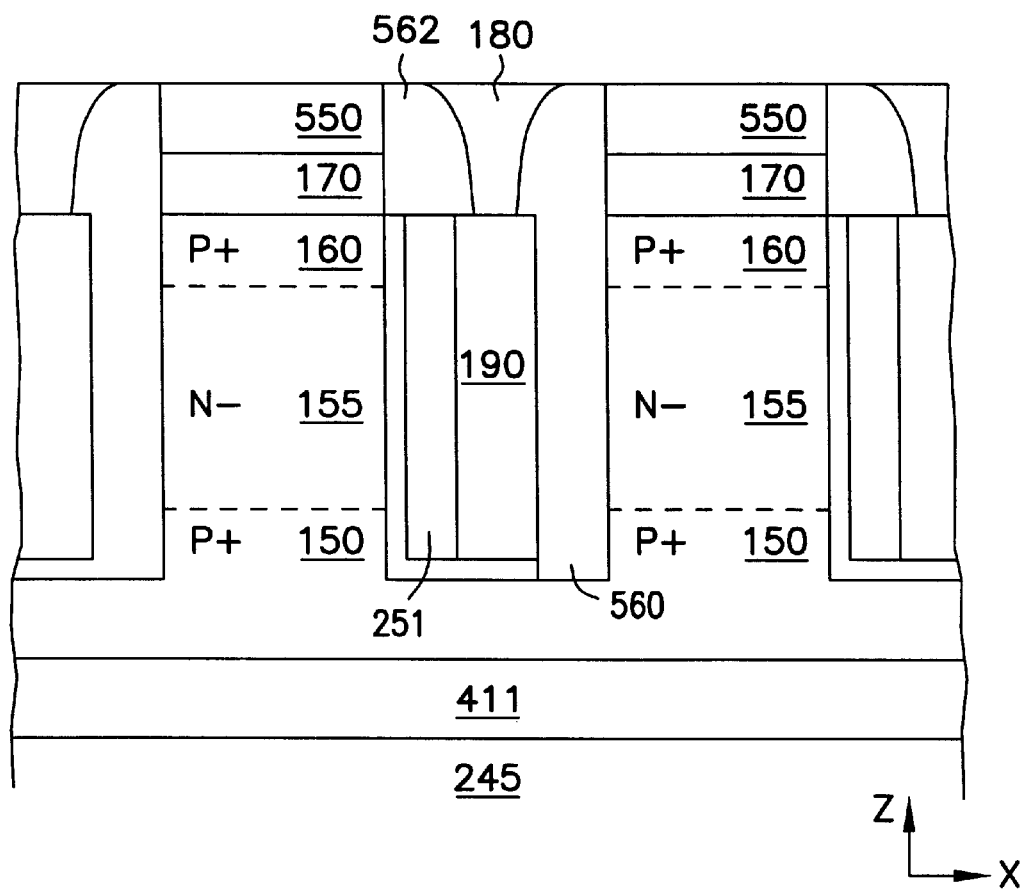

FIGS. 4A–4P illustrate generally an embodiment of a process for forming vertical transistors for a memory cell of a static random access memory (SRAM) device. This embodiment produces a true semiconductor-on-insulator (SOI) device. Alternatively, a bulk technology embodiment can be constructed using a p– substrate with a substrate bias of $V_{dd}$. The process sequence described with respect to this embodiment assumes a minimum lithographic dimension (CD) of 0.3 micrometers ($\mu$m). The lateral film thickness may be scaled for other values of CD. Further, it is noted that the suggested vertical dimensions are approximate and dependent on required voltage levels and tool tolerances.

As shown in FIG. 4A, the process begins with semiconductor wafer 245. Semiconductor wafer 245 comprises, for example, a monocrystalline silicon wafer. Semiconductor wafer 245 advantageously comprises a highly doped substrate to reduce electrical noise in the memory device. Oxide layer 400 is formed on semiconductor substrate 245 using, for example, chemical vapor deposition (CVD) of silicon oxide ($SiO_2$). The overall thickness of oxide layer 400 is approximately 0.9 micrometers ($\mu$m). A photoresist is applied and selectively exposed to provide a parallel stripe pattern at minimum width and spacing. The exposed photoresist is used as a mask to directionally etch through oxide layer 400 to form trenches 410. The photoresist is removed.

Trenches 410 are filled with a nitride material by, for example, CVD of silicon nitride ($Si_3N_4$). A working surface of the nitride material is planarized, such as by chemical mechanical polishing/planarization (CMP).

Over the next sequence of steps, trenches 410 are filled with layers of semiconductor material that will act as source/drain and body regions of vertical devices in the SRAM array. Initially, bars of semiconductor material are formed in trenches 410. In later steps, portions of each bar are removed so as to define columns of individual vertical transistors. Each transistor in the column is the same conductivity type, e.g., all of the transistors in one column are n-channel devices or all are p-channel devices. An SRAM cell includes transistors that are formed on four of these bars as shown in FIG. 1. Thus, an SRAM cell is formed using transistors formed from three bars of n-channel vertical transistors and one bar of p-channel transistors. For sake of clarity in the drawings, however, the process of forming the p-channel and n-channel transistors is described using only one bar for each conductivity type. The other two bars are formed in a similar manner as the pictured n-channel device.

Photoresist layer 420 is applied and selectively exposed to provide a mask to cover nitride filled trenches 410 that will house n-channel transistors. The nitride material is removed from the unmasked trenches. Photoresist layer 420 is removed, such as by conventional photoresist stripping techniques.

FIG. 4B illustrates the structure of the portion of the array after the next sequence of process steps. Source/drain layer 151 is formed by, for example, expitaxial growth of n+ silicon in open trenches 410. The overall thickness of layer 151 is approximately 0.2 micrometers ($\mu$m). Body region layer 156 is formed by epitaxial growth of, for example, p– silicon with a thickness of approximately 0.3 $\mu$m on layer 151. Second source/drain layer 161 of n+ silicon is formed by, for example, epitaxial growth on layer 155 with a thickness of approximately 0.2 $\mu$m. In this manner, bar 432 of semiconductor material is formed in open trenches 410. A top surface of layer 161 is recessed below a top surface of layer 400 by approximately 0.2 $\mu$m. Oxide cap 401 is grown on layer 161 with a thickness of approximately 20 to 50 nanometers.

The remaining nitride material is removed from trenches 410 to allow formation of p-channel transistors. Source/drain layer 150 is formed by, for example, expitaxial growth of p+ silicon in open trenches 410. The overall thickness of layer 150 is approximately 0.2 micrometers ($\mu$m). Body region layer 156 is formed by, for example, epitaxial growth of n– silicon with a thickness of approximately 0.3 $\mu$m on layer 150. Second source/drain layer 160 of, for example, p+ silicon is formed by epitaxial growth on layer 155 with a thickness of approximately 0.2 $\mu$m. In this manner, bar 431 of semiconductor material is formed in open trenches 410. A top surface of layer 160 is recessed below a top surface of layer 400 by approximately 0.2 $\mu$m. The structure is now as shown in FIG. 4B.

FIG. 4C illustrates the structure after the next series of process steps. Oxide cap 401 is stripped from bar 432. Nitride layer 405 is formed by, for example, chemical vapor deposition of $Si_3N_4$ so as to fill the recesses over bars 431 and 432. Nitride layer 405 is planarized using, for example, chemical/mechanical polishing to create a working surface of nitride layer 405 that is substantially co-planar with a working surface of oxide layer 400. A layer of photoresist material is deposited and exposed so as to expose the array portion of the static random access memory device. Thus, the ends of bars 432 and 432 are left covered by the photoresist mask. With the mask in place, oxide layer 400 is removed.

Nitride material is deposited using, for example, chemical vapor deposition to form a layer of material with a thickness of approximately 20 nanometers. This covers sidewalls 407 of bars 431 and 432. The nitride material is directionally etched by, for example, a reactive ion etching technique so as to remove the nitride material from horizontal surfaces. The remaining nitride material forms nitride spacers 408 on sidewalls 407 of bars 431 and 432. It is noted that nitride layer 405 on top of bars 431 and 432 remains in tact during these steps.

Next, insulator layer 411 is formed between bars 431 and 432 and substrate 245 so as to form a semiconductor on insulator (SOI) structure. Oxide layer 411 is formed using, for example, the techniques of U.S. application Ser. No. 08/745,708, entitled *Silicon-On-Insulator Islands and Method for Their Formation* (the '708 Application), or U.S. Pat. No. 5,691,230, entitled *Technique for Producing Small Islands of silicon on Insulator* (the '230 Patent). The '708 Application and the '203 Patent are incorporated by reference. Nitride layer 405 and nitride spacers 408 are removed using, for example, a phosphoric acid etch.

FIG. 4D is an elevational view illustrating the structure after the next sequence of steps. Oxide layer 445 is formed by, for example, chemical vapor deposition of silicon oxide to cover bars 431 and 432. Nitride cap 460 is formed by, for example, chemical vapor deposition of a nitride material with a thickness of approximately 0.1 $\mu$m. A photoresist is applied and selectively exposed to provide a mask which defines a minimum dimension stripe pattern orthogonal to bars 431 and 432. Nitride cap 460 and the oxide layer 445 are etched through, such as by RIE, to the point where the top surface of bars 431 and 432 are exposed. The photoresist is removed by conventional photoresist stripping techniques.

The portions of bars 431 and 432 exposed through layer 460 are selectively etched to expose portions of layers 150 and 151, respectively. The exposed portions of layer 150 and 151 are respectively identified as rails 430 and 440. A top view of this structure is shown in FIG. 4E and a perspective view is shown in FIG. 4F.

FIG. 4G illustrates the structure following the next set of fabrication steps. A layer of oxide material is thermally grown on the exposed semiconductor surfaces of bars 431 and 432. This oxide material forms gate insulator 310 on vertical sidewalls 407 as well as oxide layer 312 on rails 430 and 440.

FIG. 4H illustrates a cross-sectional view of FIG. 4G, along cut line 4H—4H. Gate material 250 is deposited on oxide layer 312 by chemical vapor deposition of n+ polysilicon. Gate material 250 fills cavities in bars 431 and 432. The gate material is planarized to a level that is approximately co-planar with a working surface of nitride layer 460.

FIG. 4I illustrates the structure after the next sequence of process steps. A photoresist is applied and selectively exposed to provide a mask which reveals the portions of gate material 250 which are positioned over the top of the rails 430 (the p+ rails). Gate material 250 is etched out, stopping on the oxide layer 312 and gate oxide 310. Gate oxide 310 is removed and then the photoresist layer is also removed. Gate oxide 310b is formed on the exposed silicon of bar 431. Gate material 251 is deposited by chemical vapor deposition. Gate material 251 comprises, for example, p+ polysilicon. Gate material 251 is planarized using, for example, chemical/mechanical planarization techniques such that a working surface of gate material 251 is co-planar with layer 460 and gate material 250. The p+ polysilicon gate material 251 is better suited for PMOS devices. Gate materials 250 and 251 are next etched to recess them below the surface of the top of their respective bars, 432 and 431. This is accomplished using, for example, a reactive ion etching process.

FIG. 4J is a top view of the structure. Nitride spacer layer 500 is deposited, such as by CVD with a thickness of ¼ of the critical dimension or minimum feature size ("CD" or "F") of the process. Nitride spacer layer 500 is etched to leave on the sides of nitride layer 460 and oxide layer 445. In one embodiment, nitride spacer layer 500 is etched by reactive ion etching (RIE).

FIG. 4K is a perspective view illustrating the structure after the next sequence of steps. Photoresist layer 446 is applied and exposed to form a mask which reveals portions of oxide layer 445 that lie between adjacent bars 431 and 432 that will house transistors to be coupled to form an inverter. The exposed oxide 445 between gate material 250 and 251 is selectively etched through an RIE process using nitride layer 500 as a mask. The etching is to be timed to reach a sufficient depth to provide access for gate contact conduction, but not to a depth which reaches substrate 245. Next, gate material 250 and 251 respectively, are selectively etched using the overhanging nitride spacer layer 500 as a mask. This step leaves n+ and p+ polysilicon gate material on opposing vertical sidewalls 300a and 300b. The selective etching is timed to a sufficient depth to stop on oxide layer 312. The structure is now as it appears in FIG. 4K.

Next, the nitride spacer layers 500 and nitride cap 460 are stripped. FIG. 4L illustrates the structure after the next series of steps, viewed along the cut line 4L—4L of FIG. 4K. Gate contact 190 is deposited by CVD to fill the space between opposing gate materials 251. In one embodiment, gate contact 190 is tungsten. In another embodiment, gate contact 190 is any other suitable refractory metal. Gate contact 190 is recessed through an RIE process to approximately the level of the top of bars 431 and 432, and likewise to a sufficient depth to expose the tops of the gate materials 250 and 251, respectively.

FIG. 4M illustrates the same view after the next sequence of steps. A photoresist is applied and exposed to create a mask with stripes that cover one of the two gate materials 250 and 251 between adjacent pillars of semiconductor material 252 of bars 431 and 432. The exposed gate material 250 and 251 is removed leaving one gate in each trench that separates adjacent pillars 252. The photoresist is removed. Intrinsic polysilicon layer 530 is deposited to fill space left by the removal of the gate material 250 and 251. Intrinsic polysilicon layer 530 can be applied through a CVD process. Intrinsic polysilicon layer 530 is then planarized by a CMP process that stops on a working surface of oxide layer 445.

FIG. 4N illustrates the structure following the next sequence of steps in the fabrication process. A photoresist is applied and exposed to define a mask in the openings that extend between adjacent source/drain layers 160 and 161. Oxide layer 445 is etched to expose the underlying second source/drain regions, 160 and 161. The etching is performed by any number of conventional etching processes, such as RIE. Then, the photoresist is removed and electrical contact 170 is deposited. Electrical contact 170 is a metal such as tungsten (W) or titanium (Ti). However, in an alternate embodiment, other forms of conductors with similar conduction properties may be used. At this point, electrical contact 170 is planarized until even with intrinsic polysilicon layer 530. The structure is now as it appears in FIG. 4N.

FIG. 4O illustrates the structure following the next sequence of steps in the fabrication process. The electrical contact 170 is recessed by RIE methods to approximately 0.05–0.1 μm. Nitride layer 550 is formed upon the electric contact. Nitride layer 550 is approximately 0.15 μm in thickness and deposited by CVD. CMP is used once more to planarize, leaving nitride layer 550 on top of the electrical contact 170.

FIG. 4P shows the structure following the final sequence of process steps. A photoresist is applied and exposed to form a mask which is to define contact studs for gate line contact 190. Intrinsic polysilicon 560 is removed. The photoresist layer is also removed. Oxide is deposited with a thickness of ¼ CD such as by CVD. The oxide is directionally etched to leave as spacers 562. Next, contact 180 is deposited by CVD. In one embodiment, contact 180 comprises a refractory metal. In an alternative embodiment, the electrical input 180 comprises polysilicon. A thick dielectric layer is deposited to act as a wiring insulator. At this point, the process has produced an array of inverters and access transistors that can now be connected through conventional wiring techniques to form cells of a static random access memory array of the type described above with respect to FIGS. 1 through 3.

Figure 5:
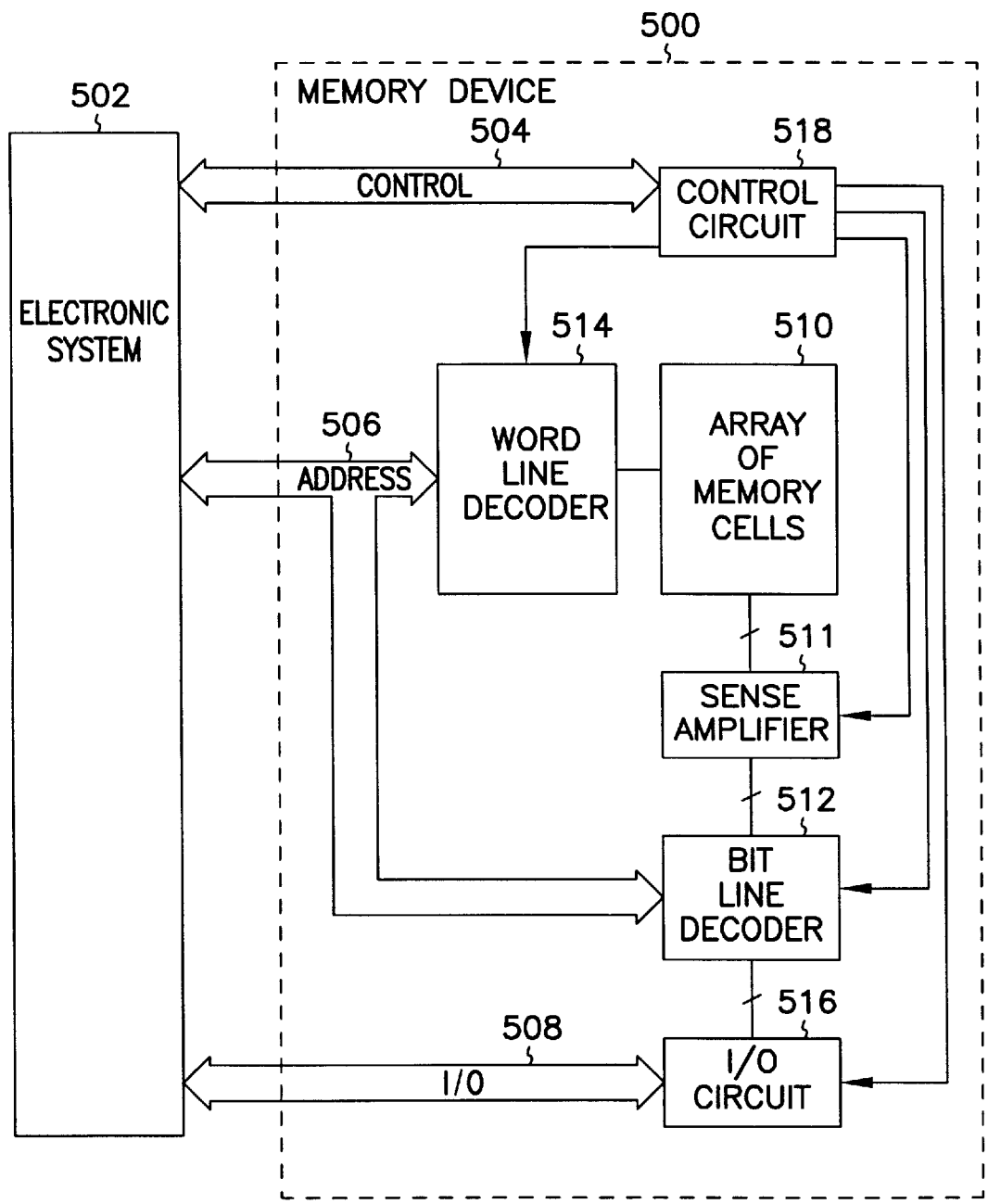
FIG. 5 is a block diagram of an embodiment of a static random access memory device constructed according to the teachings of the present invention.

FIG. 5 is a block diagram of an illustrative embodiment of the present invention. This embodiment includes memory device 500 that is coupled to electronic system 502 by control lines 504, address lines 506 and input/output (I/O) lines 508. Electronic system 502 comprises, for example, a microprocessor, a processor based computer, microcontroller, memory controller, a chip set or other appropriate system for reading and writing data in a memory device. Memory device 500 includes array of memory cells 510 that is coupled to word line decoder 514 and sense amplifier 511. Array of memory cells 510 comprises a number of static random access memory (SRAM) cells. Each cell includes cross-coupled inverters and two access transistors. The transistors in each cell are formed in vertical pillars as in the embodiment of FIG. 1, above. Array 510 is coupled to sense amplifier 511.

Word line decoder 514 includes word line drivers that are coupled to word lines of array 510. Sense amplifier 511 is coupled to bit line decoder 512. Bit line decoder 512 and word line decoder 514 are coupled to address lines 506. Bit line decoder 512 is coupled to I/O circuit 516. I/0 circuit 516 is coupled to I/O lines 508. Control circuit 518 is coupled to control lines 504, sense amplifier 511, word line decoder 514, bit line decoder 512, and I/O circuit 516.

In operation, electronic system 502 provides signals on address lines 506 and control lines 504 when data is to be read from or written to a cell of array 510. Word line decoder 514 determines the word line of a selected cell of array 510 using the address provided on address lines 506. Further, bit line decoder 512 determines the bit line of the selected cell of array 510. In a read operation, sense amplifier 511 detects the value stored in the selected cell based on bit lines of array 510. Sense amplifier 511 provides this voltage to I/O circuit 516 which, in turn, passes data to electronic system 502 over I/O lines 508. In a write operation, I/O circuit 516 passes data from I/O lines 508 to sense amplifier 512 for storage in the selected cell of array 510.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the minimum feature size can be varied from the 0.3 μm value disclosed. The teachings of the present invention can be applied to a six transistor embodiment with depletion mode n-channel transistors as load devices for the inverters. In another embodiment, the inverters for an array of SRAM cells can be constructed using the teachings of commonly assigned, co-pending application Ser. No. 09/028,805, filed Feb. 24, 1998, entitled *Circuits and Methods Using Vertical, Complementary Transistors*, which application is incorporated herein by reference.

What is claimed is:

1. A memory cell, comprising;
    a flip-flop that includes a cross-coupled pair of inverters;
    wherein the inverters each include a pair of complementary, vertical transistors, each transistor utilizing one of a pair of single pillars of semiconducting material, with a gate contact that interconnects the gates of the inverters and acts as the input of the inverter and a shunt that interconnects a first source/drain region of the complementary transistors and acts as the output of the inverter;
    a first vertical, access transistor with a gate that is coupled to a word line and a first source/drain region coupled to the output of one of the inverters and a second source/drain region that is coupled to a first bit line; and
    a second vertical, access transistor with a gate that is coupled to the word line and a first source/drain region coupled to the output of the other inverter and a second source/drain region that is coupled to a second bit line.

2. The memory cell of claim 1, wherein the bit lines comprise a layer of doped semiconductor material that is integral with the second source/drain region of the vertical, access transistor.

3. The memory cell of claim 1, wherein the bit line is formed below the body region of the vertical access, transistor.

4. The memory cell of claim 1, wherein the gate contact comprises tungsten that is disposed along a side of the complementary, vertical transistors of each inverter.

5. A memory cell, comprising;
    a flip-flop that includes a cross-coupled pair of inverters;
    wherein the inverters each include a pair of complementary, vertical transistors, each transistor utilizing one of a pair of single pillars of semiconducting material, with a gate contact that interconnects the gates of the inverters and acts as the input of the inverter and a shunt that interconnects a first source/drain region of the complementary transistors and acts as the output of the inverter,
    wherein the shunt comprises a tungsten shunt that is disposed on a top surface of the first source/drain regions of the complementary, vertical transistors;
    a first vertical, access transistor with a gate that is coupled to a word line and a first source/drain region coupled to the output of one of the inverters and a second source/drain region that is coupled to a first bit line; and
    a second vertical, access transistor with a gate that is coupled to the word line and a first source/drain region coupled to the output of the other inverter and a second source/drain region that is coupled to a second bit line.

6. The memory cell of claim 5, wherein the shunt further is disposed on a top surface of the first source/drain region of one of the vertical, access transistors.

7. The memory cell of claim 1, wherein the memory cell uses a surface area of a semiconductor wafer that is approximately 32 feature (F) squares.

8. The memory cell of claim 1, wherein the second source/drain regions of corresponding transistors in each inverter are integral with a bar of semiconductor material that interconnects the transistors with similar transistors in other cells.

9. A memory cell, comprising;
    a flip-flop that includes a cross-coupled pair of inverters;
    wherein the inverters each include a pair of complementary, vertical transistors, each transistor utilizing one of a pair of single pillars of semiconducting material, with a gate contact that interconnects the gates of the inverters and acts as the input of the inverter and a shunt that interconnects a first source/drain region of the complementary transistors and acts as the output of the inverter, and
    wherein the inverters are formed on a pair of oppositely doped semiconductor rails that run along a surface of a semiconductor-on-insulator wafer;
    a first vertical, access transistor with a gate that is coupled to a word line and a first source/drain region coupled to the output of one of the inverters and a second source/drain region that is coupled to a first bit line; and
    a second vertical, access transistor with a gate that is coupled to the word line and a first source/drain region coupled to the output of the other inverter and a second source/drain region that is coupled to a second bit line.

10. The memory cell of claim 9, and wherein the vertical, access transistors are formed on additional semiconductor rails that are parallel with the semiconductor rails of the inverters and that are disposed on opposite sides of the semiconductor rails of the inverters.

11. A memory device, comprising:
    a number of word lines and a number bit lines that are disposed to form an array;
    a number of memory cells addressably disposed at intersections of the word and bit lines, each memory cell comprising
    a flip-flop that includes a cross-coupled pair of inverters;

wherein the inverters each include a pair of complementary, vertical transistors, each transistor utilizing one of a pair of single pillars of semiconducting material, with a gate contact that interconnects the gates of the inverters and acts as the input of the inverter and a shunt that interconnects a first source/drain region of the complementary transistors and acts as the output of the inverter;

a first vertical access transistor with a gate that is coupled to one of the word lines and a first source/drain region coupled to the output of one of the inverters and a second source/drain region that is coupled to a first of the bit lines; and a second vertical access transistor with a gate that is coupled to the word line and a first source/drain region coupled to the output of the other inverter and a second source/drain region that is coupled to a second of the bit lines.

12. The memory device of claim 11, further comprising a word line decoder coupled to the word lines of the memory array that selectively activates the word lines of the array.

13. The memory device of claim 11, further comprising a sense amplifier that is coupled to the bit lines of the array of memory cells.

14. The memory device of claim 11, further comprising a bit line decoder coupled to the sense amplifier so as to select among the bit lines for reading and writing data to and from the memory cells.

15. The memory device of claim 11, wherein each bit line comprises a layer of doped semiconductor material that is integral with a second source/drain region of the vertical access transistors of the memory cells in the array.

16. The memory device of claim 15, wherein each bit line is formed below the body region of the vertical access transistors.

17. A memory device, comprising:
a number of word lines and a number bit lines that are disposed to form an array;
a number of memory cells addressably disposed at intersections of the word and bit lines, each memory cell comprising
  a flip-flop that includes a cross-coupled pair of inverters;
  wherein the inverters each include a pair of complementary, vertical transistors, each transistor utilizing one of a pair of single pillars of semiconducting material, with a gate contact that interconnects the gates of the inverters and acts as the input of the inverter and a shunt that interconnects a first source/drain region of the complementary transistors and acts as the output of the inverter, and
  wherein a second source/drain region of corresponding transistors in each inverter are integral with a bar of semiconductor material that interconnects the transistors with similar transistors in other cells of the array;
  a first vertical access transistor with a gate that is coupled to one of the word lines and a first source/drain region coupled to the output of one of the inverters and a second source/drain region that is coupled to a first of the bit lines; and
  a second vertical access transistor with a gate that is coupled to the word line and a first source/drain region coupled to the output of the other inverter and a second source/drain region that is coupled to a second of the bit lines.

18. A memory device, comprising:
a semiconductor-on-insulator wafer;
a number of word lines and a number bit lines that are disposed to form an array;
a number of memory cells addressably disposed at intersections of the word and bit lines, each memory cell comprising
  a flip-flop that includes a cross-coupled pair of inverters;
  wherein the inverters each include a pair of complementary, vertical transistors, each transistor utilizing one of a pair of single pillars of semiconducting material, with a gate contact that interconnects the gates of the inverters and acts as the input of the inverter and a shunt that interconnects a first source/drain region of the complementary transistors and acts as the output of the inverter;
  a first vertical access transistor with a gate that is coupled to one of the word lines and a first source/drain region coupled to the output of one of the inverters and a second source/drain region that is coupled to a first of the bit lines
  wherein the inverters are formed on pairs of oppositely doped semiconductor rails that run along a surface of the wafer; and
  a second vertical access transistor with a gate that is coupled to the word line and a first source/drain region coupled to the output of the other inverter and a second source/drain region that is coupled to a second of the bit lines.

19. The memory device of claim 18, wherein the vertical access transistors are formed on additional semiconductor rails that are parallel with the semiconductor rails of the inverters and that are disposed on opposite sides of the semiconductor rails of the inverters.

20. A memory cell, comprising:
a flip-flop that includes a cross-coupled pair of inverters;
wherein the inverters each include a pair of complementary, vertical transistors with a gate contact that interconnects the gates of the inverters and acts as the input of the inverter and a shunt that interconnects a first source/drain region of the complementary transistors and acts as the output of the inverter;
a first vertical, access transistor with a gate that is coupled to a word line and a first source/drain region coupled to the output of one of the inverters and a second source/drain region that is coupled to a first bit line, wherein the first bitline is buried beneath the body of the first vertical access transistor; and
a second vertical, access transistor with a gate that is coupled to the word line and a first source/drain region coupled to the output of the other inverter and a second source/drain region that is coupled to a second bit line, wherein the second bitline is buried beneath the body of the second vertical access transistor.

21. The memory cell of claim 20, wherein the bit lines comprise a layer of doped semiconductor material that is integral with the second source/drain region of the vertical access transistor.

22. The memory cell of claim 20, wherein the gate contact comprises tungsten that is disposed along a side of the complementary, vertical transistors of each inverter.

23. The memory cell of claim 20, wherein the memory cell uses a surface area of a semiconductor wafer that is approximately 32 feature (F) squares.

24. The memory cell of claim 20, wherein the second source/drain regions of corresponding transistors in each inverter are integral with a bar of semiconductor material that interconnects the transistors with similar transistors in other cells.

25. A memory cell, comprising:
a flip-flop that includes a cross-coupled pair of inverters;
wherein the inverters each include a pair of complementary, vertical transistors with a gate contact that interconnects the gates of the inverters and acts as the input of the inverter and a shunt that interconnects a first source/drain region of the complementary transistors and acts as the output of the inverter,
wherein the shunt comprises a tungsten shunt that is disposed on a top surface of the first source/drain regions of the complementary, vertical transistors;
a first vertical, access transistor with a gate that is coupled to a word line and a first source/drain region coupled to the output of one of the inverters and a second source/drain region that is coupled to a first bit line, wherein the first bitline is buried beneath the body of the first vertical access transistor; and
a second vertical, access transistor with a gate that is coupled to the word line and a first source/drain region coupled to the output of the other inverter and a second source/drain region that is coupled to a second bit line, wherein the second bitline is buried beneath the body of the second vertical access transistor.

26. The memory cell of claim 25, wherein the shunt further is disposed on a too surface of the first source/drain region of one of the vertical, access transistors.

27. A memory cell, comprising:
a flip-flop that includes a cross-coupled pair of inverters;
wherein the inverters each include a pair of complementary, vertical transistors with a gate contact that interconnects the gates of the inverters and acts as the input of the inverter and a shunt that interconnects a first source/drain region of the complementary transistors and acts as the output of the inverter;
wherein the inverters are formed on a pair of oppositely doped semiconductor rails that run along a surface of a semiconductor-on-insulator wafer;
a first vertical, access transistor with a gate that is coupled to a word line and a first source/drain region coupled to the output of one of the inverters and a second source/drain region that is coupled to a first bit line, wherein the first bitline is buried beneath the body of the first vertical access transistor; and
a second vertical, access transistor with a gate that is coupled to the word line and a first source/drain region coupled to the output of the other inverter and a second source/drain region that is coupled to a second bit line, wherein the second bitline is buried beneath the body of the second vertical access transistor.

28. The memory cell of claim 27, wherein the vertical, access transistors are formed on additional semiconductor rails that are parallel with the semiconductor rails of the inverters and that are disposed on opposite sides of the semiconductor rails of the inverters.

29. A memory device, comprising:
a number of word lines and a number of bit lines that are disposed to form an array;
a number of memory cells addressably disposed at intersections of the word and bit lines, each memory cell comprising:
a flip-flop that includes a cross-coupled pair of inverters;
wherein the inverters each include a pair of complementary vertical transistors with a gate contact that interconnects the gates of the inverters and acts as the input of the inverter and a shunt that interconnects a first source/drain region of the complementary transistors and acts as the output of the inverter;
a first vertical access transistor with a gate that is coupled to one of the word lines and a first source/drain region coupled to the output of one of the inverters and a second source/drain region that is coupled to a first of the bit lines, wherein the first bit line is buried beneath the body of the first vertical access transistor; and
a second vertical access transistor with a gate that is coupled to the word line and a first source/drain region coupled to the output of the other inverter and a second source/drain region that is coupled to a second of the bit lines, wherein the second bit line is buried beneath the body of the second vertical access transistor.

30. The memory device of claim 29, further comprising a word line decoder coupled to the word lines of the memory array that selectively activates the word lines of the array.

31. The memory device of claim 29, further comprising a sense amplifier that is coupled to the bit lines of the array of memory cells.

32. The memory device of claim 31, further comprising a bit line decoder coupled to the sense amplifier so as to select among the bit lines for reading and writing data to and from the memory cells.

33. The memory device of claim 29, wherein each bit line comprises a layer of doped semiconductor material that is integral with a second source/drain region of the vertical access transistors of the memory cells in the array.

34. A memory device, comprising:
a number of word lines and a number bit lines that are disposed to form an array;
a number of memory cells addressably disposed at intersections of the word and bit lines, each memory cell comprising:
a flip-flop that includes a cross-coupled pair of inverters;
wherein the inverters each include a pair of complementary vertical transistors with a gate contact that interconnects the gates of the inverters and acts as the input of the inverter and a shunt that interconnects a first source/drain region of the complementary transistors and acts as the output of the inverter;
wherein a second source/drain region of corresponding transistors in each inverter are integral with a bar of semiconductor material that interconnects the transistors with similar transistors in other cells of the array;
a first vertical access transistor with a gate that is coupled to one of the word lines and a first source/drain region coupled to the output of one of the inverters and a second source/drain region that is coupled to a first of the bit lines, wherein the first bit line is buried beneath the body of the first vertical access transistor; and
a second vertical access transistor with a gate that is coupled to the word line and a first source/drain region coupled to the output of the other inverter and a second source/drain region that is coupled to a second of the bit lines, wherein the second bit line is buried beneath the body of the second vertical access transistor.

35. A memory device, comprising:

a semiconductor-on-insulator wafer;

a number of word lines and a number bit lines that are disposed to form an array;

a number of memory cells addressably disposed at intersections of the word and bit lines, each memory cell comprising:

a flip-flop that includes a cross-coupled pair of inverters;

wherein the inverters each include a pair of complementary vertical transistors with a gate contact that interconnects the gates of the inverters and acts as the input of the inverter and a shunt that interconnects a first source/drain region of the complementary transistors and acts as the output of the inverter;

wherein the inverters are formed on pairs of oppositely doped semiconductor rails that run along a surface of the wafer;

a first vertical access transistor with a gate that is coupled to one of the word lines and a first source/drain region coupled to the output of one of the inverters and a second source/drain region that is coupled to a first of the bit lines, wherein the first bit line is buried beneath the body of the first vertical access transistor; and a second vertical access transistor with a gate that is coupled to the word line and a first source/drain region coupled to the output of the other inverter and a second source/drain region that is coupled to a second of the bit lines, wherein the second bit line is buried beneath the body of the second vertical access transistor.

36. The memory device of claim 18, wherein the vertical access transistors are formed on additional semiconductor rails that are parallel with the semiconductor rails of the inverters and that are disposed on opposite sides of the semiconductor rails of the inverters.

\* \* \* \* \*

UNITED STATES PATENT AND TRADEMARK OFFICE
CERTIFICATE OF CORRECTION

PATENT NO. : 6,304,483 B1  
DATED : October 16, 2001  
INVENTOR(S) : Wendell P. Noble It is certified that error appears in the above-identified patent and that said Letters Patent is hereby corrected as shown below:

Column 1,
Line 7, delete "circuit More" and insert -- circuits. More --, therefor.

Column 4,
Line 37, delete "filly" and insert -- fully --, therefor.

Column 5,
Line 38, delete "An" before "SRAM" and insert -- A --, therefor.
Line 40, delete "an" after "Thus" and insert -- A --, therefor.

Column 6,
Line 47, delete " '203" and insert -- '230 --, therefor.

Column 9,
Line 39, delete ";" after "comprising" and insert -- : --, therefor.

Column 10,
Lines 1 and 33, delete ";" after "comprising" and insert -- : --, therefor.
Line Line 61, insert -- of -- between "number" and "bit".
Line 65, insert -- : -- after "comprising".

Column 11,
Line 42, insert -- : -- after "comprising".

Column 12,
Line 7, insert -- : -- after "comprising".

Signed and Sealed this

Fourth Day of June, 2002

*Attest:*

*Attesting Officer*

JAMES E. ROGAN
*Director of the United States Patent and Trademark Office*